US011804548B2

(12) United States Patent
Huang et al.

(10) Patent No.: US 11,804,548 B2
(45) Date of Patent: Oct. 31, 2023

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Yuan-Sheng Huang, Taichung (TW); Ryan Chia-Jen Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/716,976

(22) Filed: Apr. 8, 2022

(65) Prior Publication Data
US 2022/0238708 A1   Jul. 28, 2022

Related U.S. Application Data

(63) Continuation of application No. 16/990,946, filed on Aug. 11, 2020, now Pat. No. 11,302,816.

(51) Int. Cl.
*H01L 29/78* (2006.01)
*H01L 21/8234* (2006.01)
*H01L 29/66* (2006.01)
*H01L 29/417* (2006.01)

(52) U.S. Cl.
CPC .... *H01L 29/785* (2013.01); *H01L 21/823431* (2013.01); *H01L 29/41791* (2013.01); *H01L 29/66795* (2013.01)

(58) Field of Classification Search
CPC ............ H01L 29/785; H01L 29/66795; H01L 29/41791; H01L 21/823431; H01L 2029/7858; H01L 27/0886
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 11,302,816 | B2 * | 4/2022 | Huang .............. H01L 29/66795 |
| 2016/0233298 | A1 * | 8/2016 | Webb .................... H01L 29/785 |
| 2018/0374859 | A1 * | 12/2018 | Park ................ H01L 21/823437 |

* cited by examiner

*Primary Examiner* — Changhyun Yi
(74) *Attorney, Agent, or Firm* — WPAT LAW; Anthony King

(57) ABSTRACT

A semiconductor structure is provided. The semiconductor structure includes fin structures, a gate structure across the fin structures, and a dielectric layer. The gate structure includes a work function layer over the gate dielectric layer, and a contact layer over the work function layer. A portion of the work function layer is located between the fin structures, and a top surface of the portion is higher than a top surface of the fin structures. A top surface of the work function layer and a top surface of the dielectric layer are substantially on a same level. A method for forming a semiconductor structure is also provided.

20 Claims, 32 Drawing Sheets

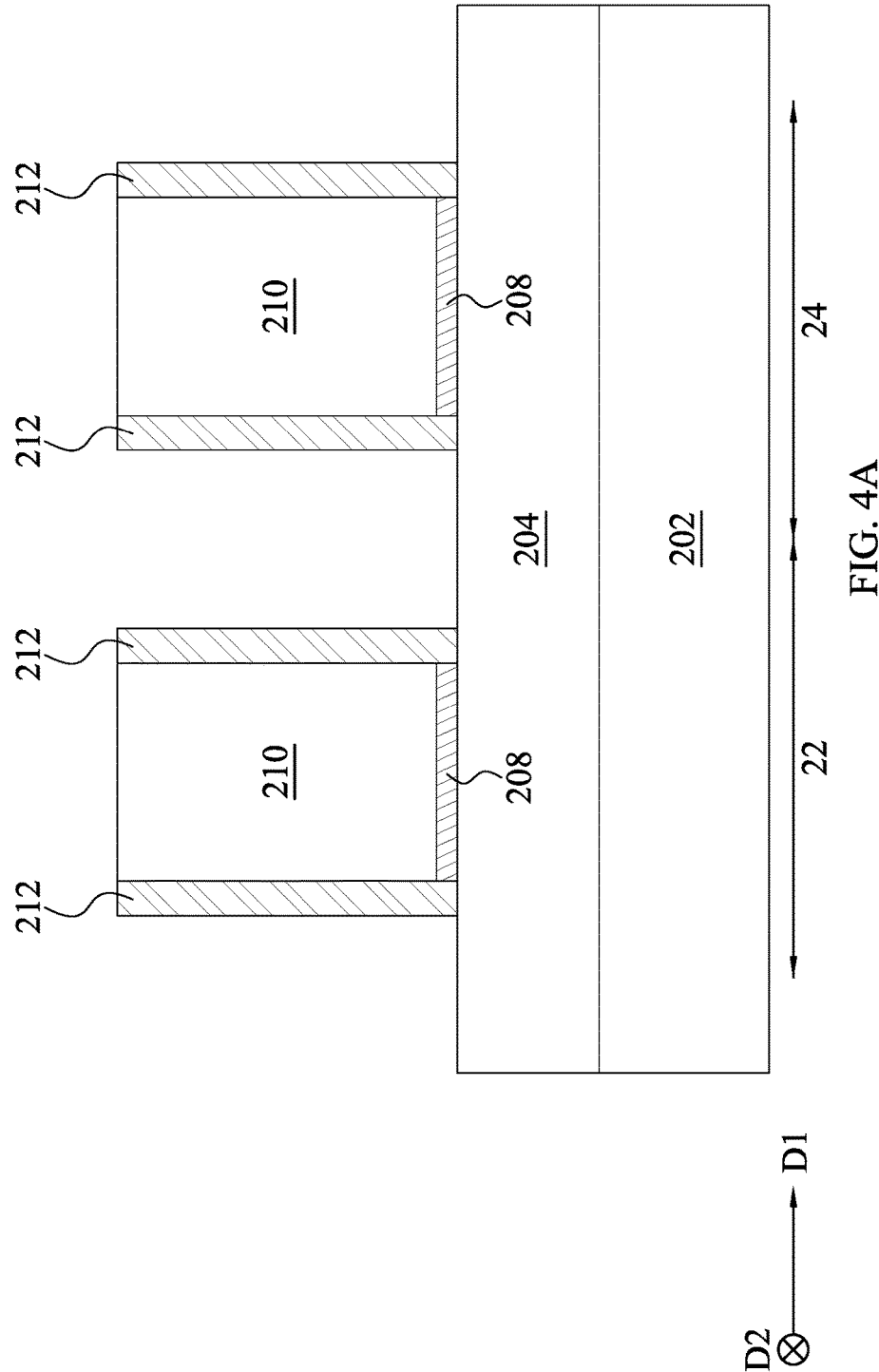

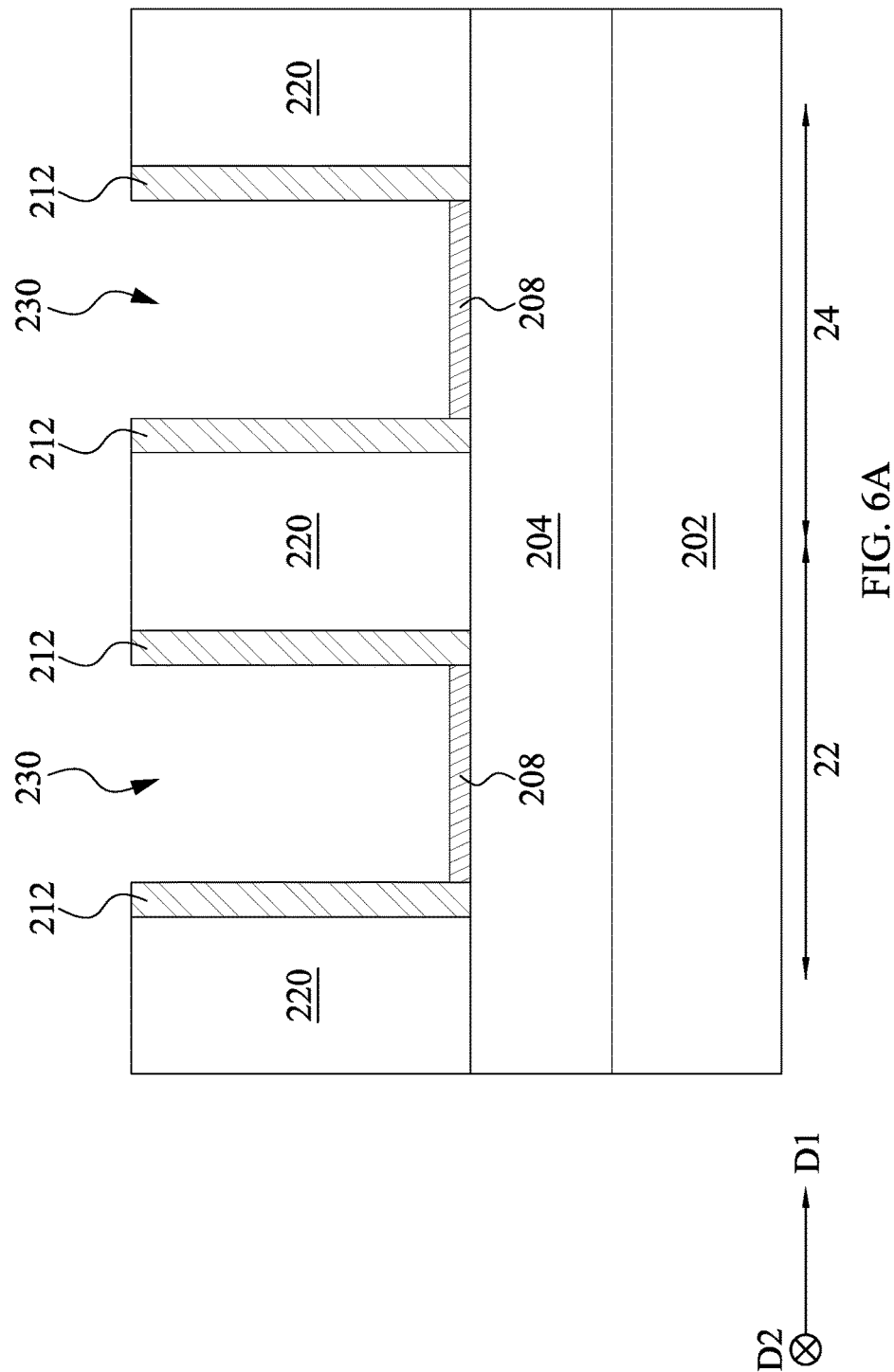

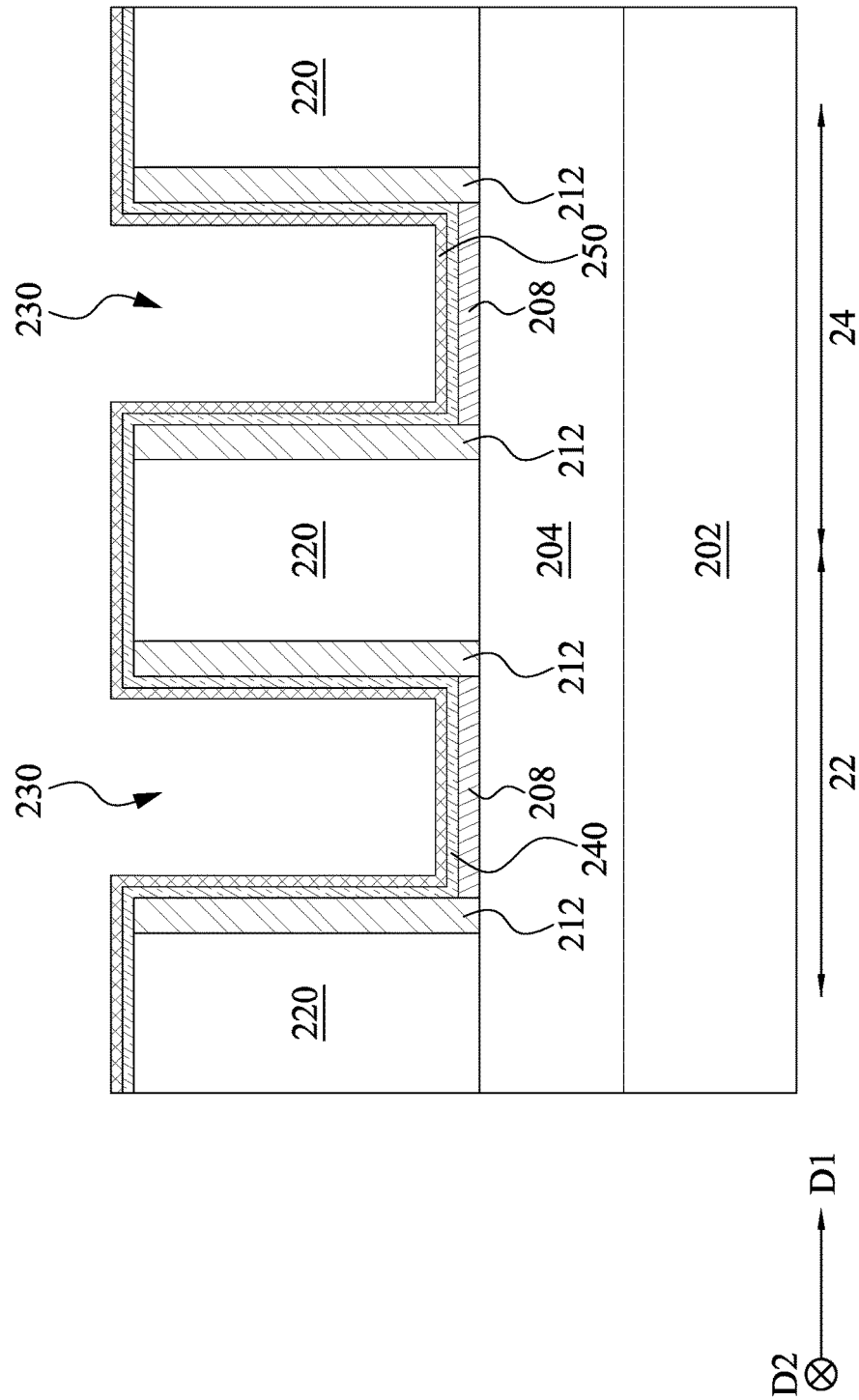

SEMICONDUCTOR STRUCTURE AND METHOD FOR FORMING THE SAME

PRIORITY CLAIM AND CROSS-REFERENCE

This application is a continuation of U.S. patent application Ser. No. 16/990,946 filed on Aug. 11, 2020, entitled of "SEMICONDUCTOR STRUCTURE AND METHOD FOR FORMING THE SAME", which is incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. As technology nodes shrink, in some IC designs, there has been a desire to replace the polysilicon gate electrode with a metal gate electrode to improve device performance with the decreased feature sizes. The resistance of the metal gate electrode becomes crucial as the dimensions of transistors decrease.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A, 5A, 6A, 7A, 8A and 9A are cross-sectional views illustrating a semiconductor structure at various fabrication stage subsequent to FIG. 3A according to aspects of the present disclosure in one or more embodiments.

DETAILED DESCRIPTION

Figure 1:
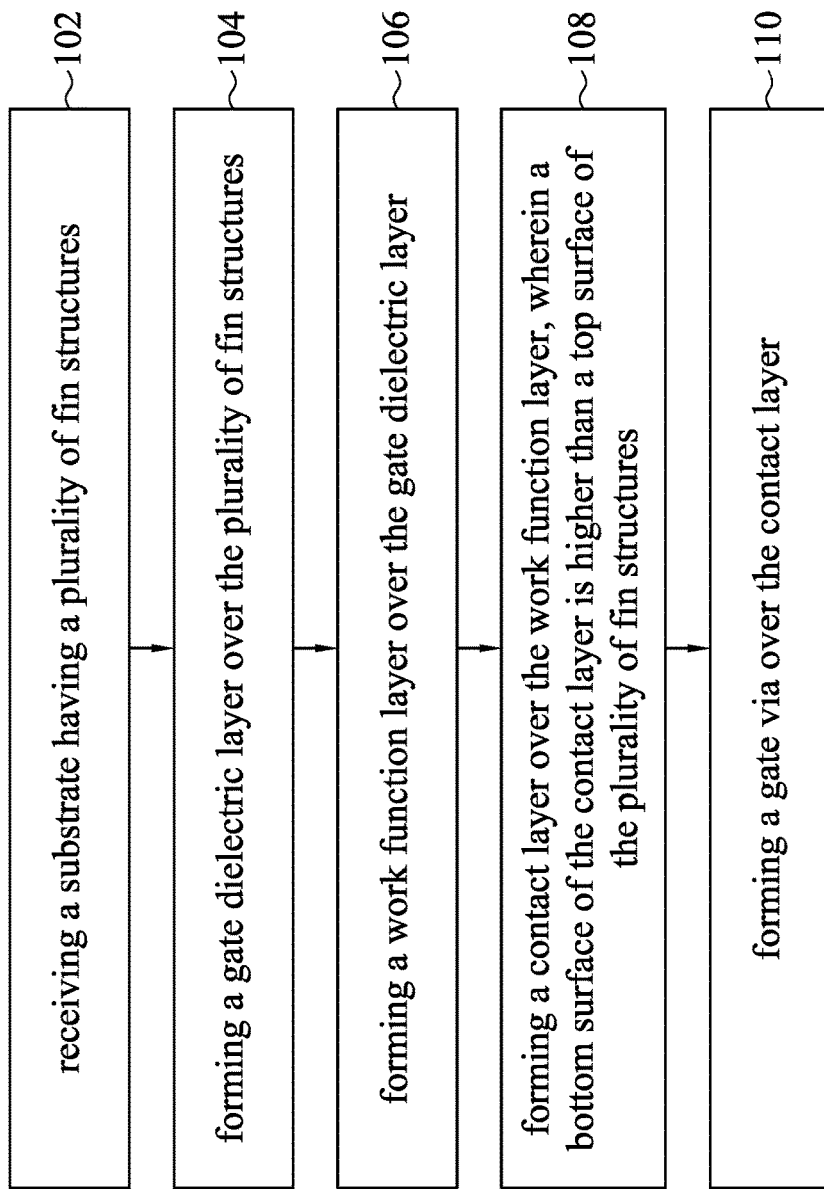
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

One advancement implemented to realize the smaller feature sizes is the use of fin field effect transistor (finFET) devices. FinFET devices may allow for shrinking the size of device while providing a gate on the sides and/or top of the fin structure. Metal gate electrodes have been used to replace the polysilicon gate electrode to improve device performance with the decreased feature sizes. Metal gate electrodes may be arranged on the sides and/or top of the fin structure. In some embodiments, the metal gate electrodes may be arranged between the fin structures. The resistance of the metal gate electrode is crucial as the dimensions of transistors decrease. The resistance of the metal gate electrode may be improved by using low resistance contact metal. However, the presence of the contact metal between the fin structures may induce triggered voltage instability. As the dimensions of the metal gate electrode decrease, the issue of triggered voltage instability becomes severe and the device performance may be reduced.

Embodiments of a semiconductor structure and a method for forming the same are therefore provided. The semiconductor structure is formed in a replacement polysilicon gate (RPG) or gate-last process in accordance with the embodiments. The semiconductor structure can be formed in a non-planar device in alternative embodiments. In some embodiments, a bottom surface of the contact metal is higher than a top surface of the fin structures. In some embodiments, the contact metal is not between the fin structures. Accordingly, the triggered voltage instability issue can be mitigated.

FIG. 1 is a flowchart representing a method 10 for forming a semiconductor structure according to aspects of the present disclosure. It is understood that additional steps can be provided before, during, and after the method 10, and some of the steps described can be replaced or eliminated for other embodiments of the method. The method for forming a semiconductor structure 20 includes an operation 102 where a substrate is received. In some embodiments, the substrate includes fin structures. The method 10 further includes an operation 104 where a gate dielectric layer is formed over the fin structures. In some embodiments, the gate dielectric layer surrounds the fin structures. The method 10 further includes an operation 106 where a work function layer is formed over the gate dielectric layer. The method 10 further includes an operation 108 where a contact layer is formed over the work function layer. In some embodiments, a bottom surface of the contact layer is higher than a top surface of the fin structures. In other embodiments, a portion of the work function layer is removed prior to the forming of the contact layer. In some embodiments, the operation 108 further includes selectively forming the contact layer over the work function layer. The method 10 further includes an operation 110 where a gate via is formed over the contact layer. In some embodiments, the gate via is directly formed over the contact layer.

Figure 2:
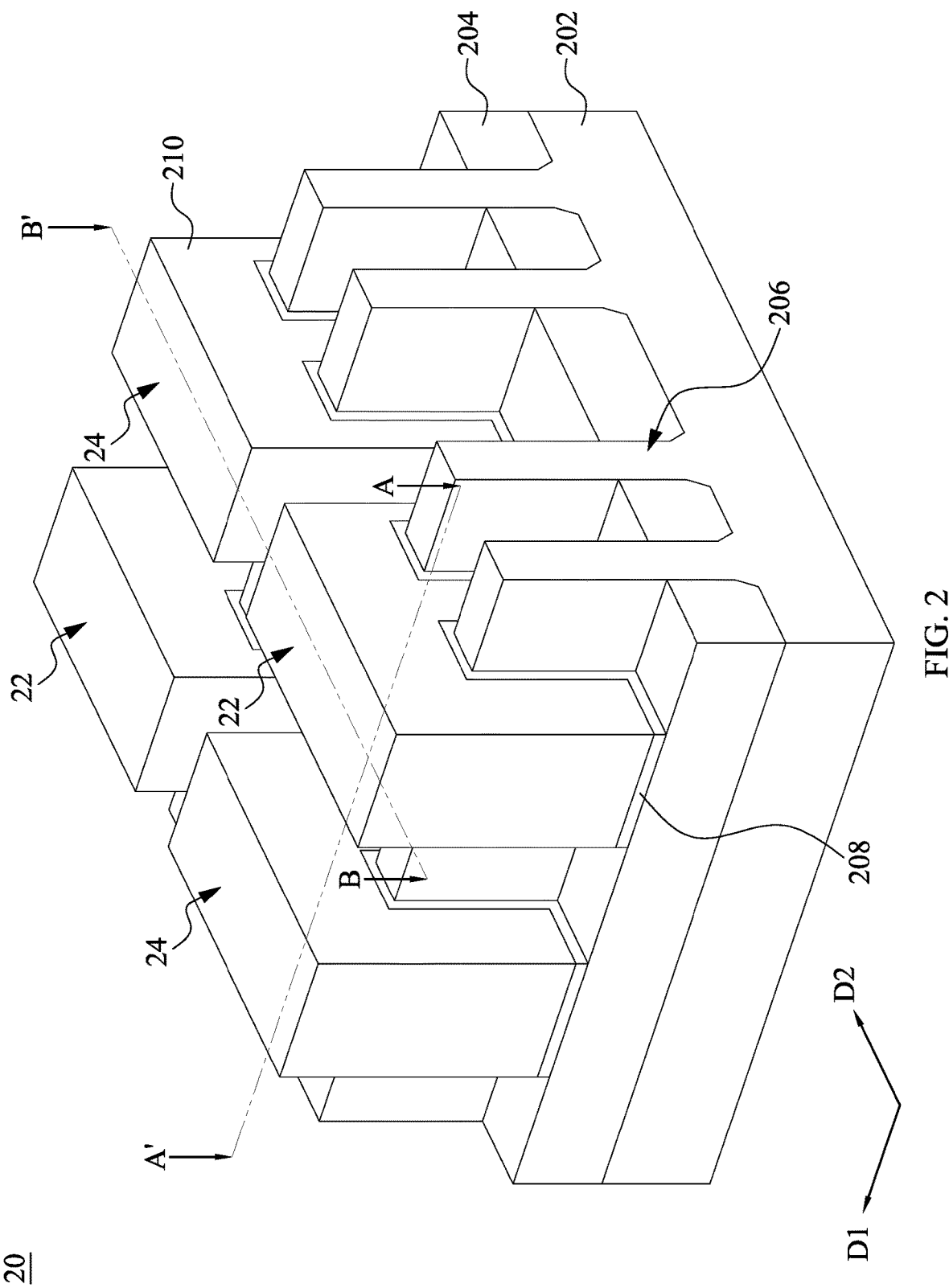
FIG. 2 is a schematic drawing illustrating a semiconductor structure at a fabrication stage constructed according to aspects of the present disclosure in one or more embodiment.
Figure 3A:
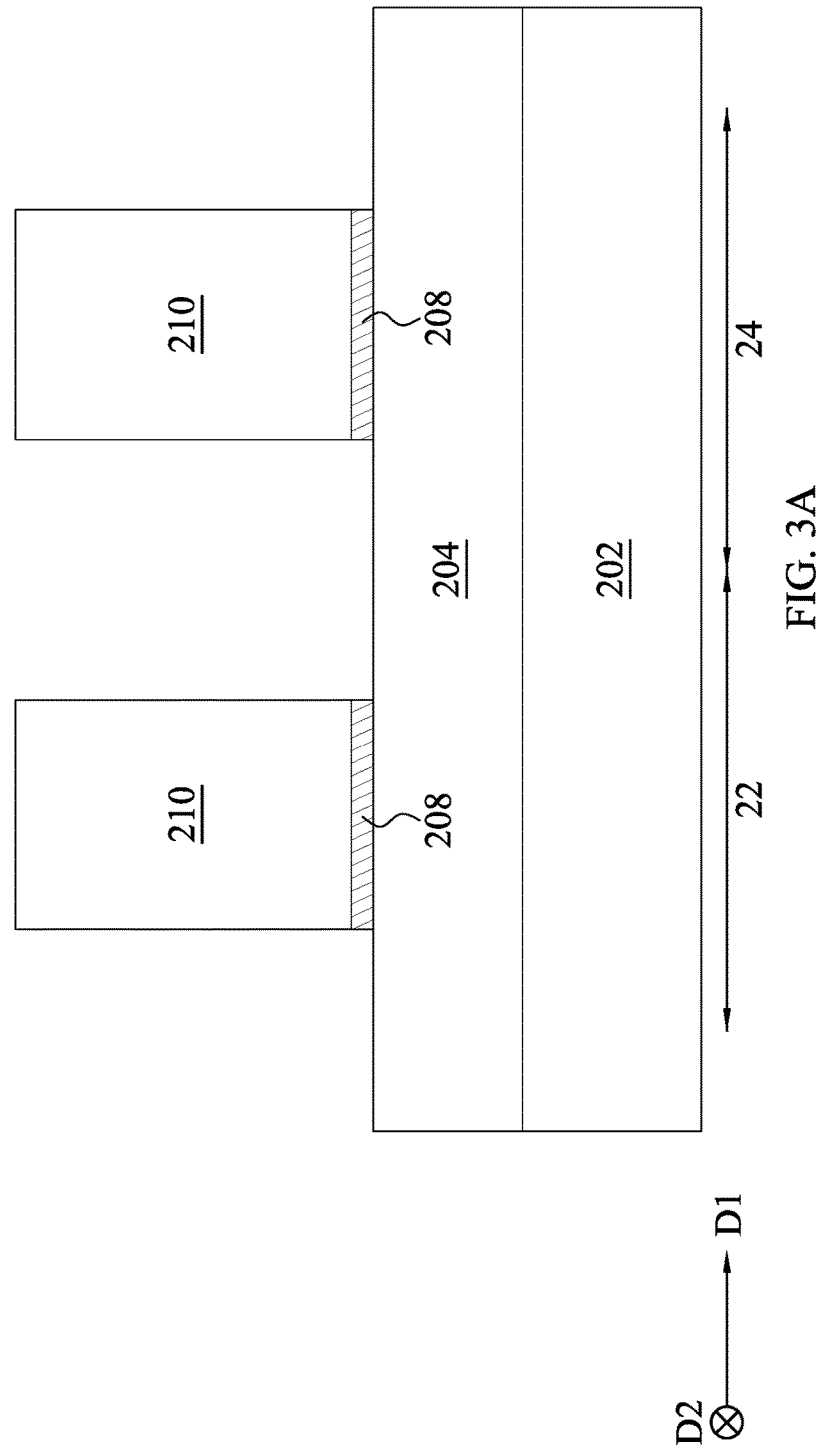
FIGS. 3A and 3B are cross-sectional views taken along a line A-A' and a line B-B' of FIG. 2, respectively, according to aspects of the present disclosure in one or more embodiments.
Figure 3B:
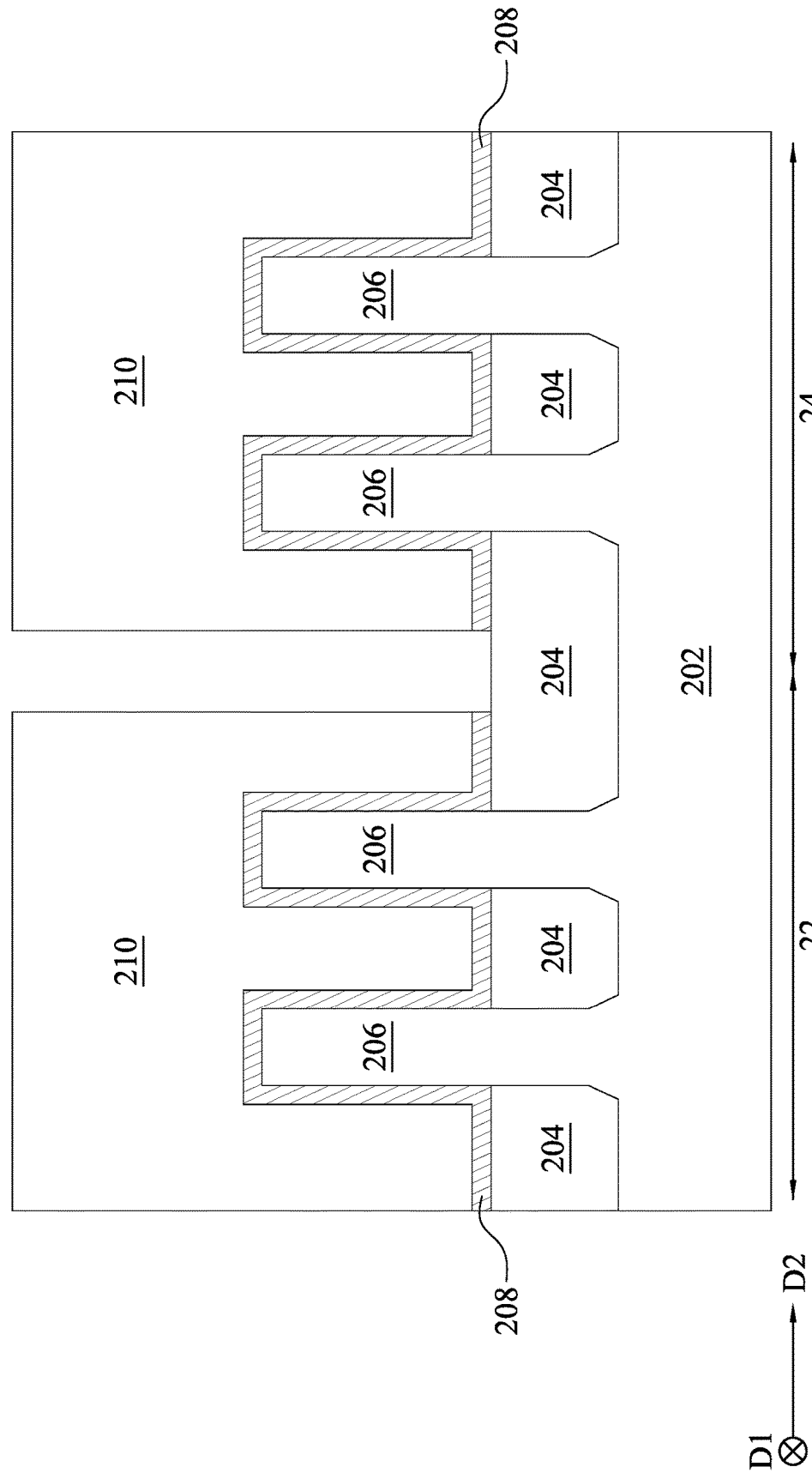

FIG. 2 is a schematic drawing illustrating a semiconductor structure 20 at a fabrication stage constructed according to aspects of the present disclosure in one or more embodiment. FIGS. 3A and 3B are cross-sectional views taken along a line A-A' and a line B-B' of FIG. 2, respectively, according to aspects of the present disclosure in one or more embodiments. As shown in FIGS. 2, 3A and 3B, a substrate 202 is received according to operation 102. The substrate 202 may be a semiconductor wafer such as a silicon wafer. Alternatively or additionally, the substrate 202 may include elementary semiconductor materials, compound semiconductor materials, or alloy semiconductor materials.

The substrate 202 may include various doping configurations depending on design requirements as is known in the art. For example, different doping profiles (e.g., n wells, p wells) may be formed on the substrate 202 in regions designed for different device types (e.g., n-type metal-oxide-semiconductor (NMOS) device, p-type metal-oxide-semiconductor (PMOS) device). The suitable doping may include ion implantation of dopants and/or diffusion processes. In some embodiments, the semiconductor structure 20 may include first devices 22 and second devices 24. The first device 22 and the second device 24 may be different types of MOS devices. In some embodiments, the first device 22 may be a NMOS device and the second device 24 may be a PMOS device. In some embodiments, the first device 22 may be a PMOS device and the second device 24 may be a NMOS device.

The substrate 202 typically has isolation structures (e.g., shallow trench isolation (STI) structures) 204 interposing the regions containing different device types. In some embodiments, the substrate 202 can include fin structures 206 electrically isolated from each other by the isolation structures 204. In some embodiments, the fin structures 206 extend along a first direction D1. In some embodiments, the fin structures 206 extending along the first direction D1 are disconnected in regions designed for different device types. In some embodiments, a width of the fin structure 206 is within a range of approximately 1 nanometer to approximately 10 nanometers, but the disclosure is not limited thereto.

In some embodiments, a patterned dielectric layer 208 and a sacrificial gate layer 210 is formed. The sacrificial gate layer 210 extends along a second direction D2 different from the first direction D1. Additionally, the first direction D1 and the second direction D2 are in the same horizontal plane. In some embodiments, the sacrificial gate layer 210 extending in the second direction D2 are disconnected in regions designed for different device types. In some embodiments as shown in FIGS. 2 and 3B, the sacrificial gate layer 210 extending in the second direction D2 may be divided into two segments. The patterned dielectric layer 208 and the sacrificial gate layer 210 covers the isolation structures 204, the sidewalls of the fin structures 206 and top surfaces of the fin structures 206. In some embodiments, the patterned dielectric layer 208 includes silicon oxide (SiO), but the disclosure is not limited thereto. In some embodiments, the sacrificial gate layer 210 is made of polysilicon, but the disclosure is not limited thereto. In some embodiments, the patterned dielectric layer 208 and the sacrificial gate layer 210 are formed by a patterning operation.

FIGS. 4A through 16B are cross-sectional views illustrating a semiconductor structure at various fabrication stage subsequent to FIGS. 3A and 3B according to aspects of the present disclosure in one or more embodiments. In FIGS. 4A through 16B, figures ending with an "A" designation are illustrated along a similar cross-section A-A' as FIG. 2, and figures ending with a "B" designation are illustrated along a similar cross-section B-B' as FIG. 2.

Figure 4B:
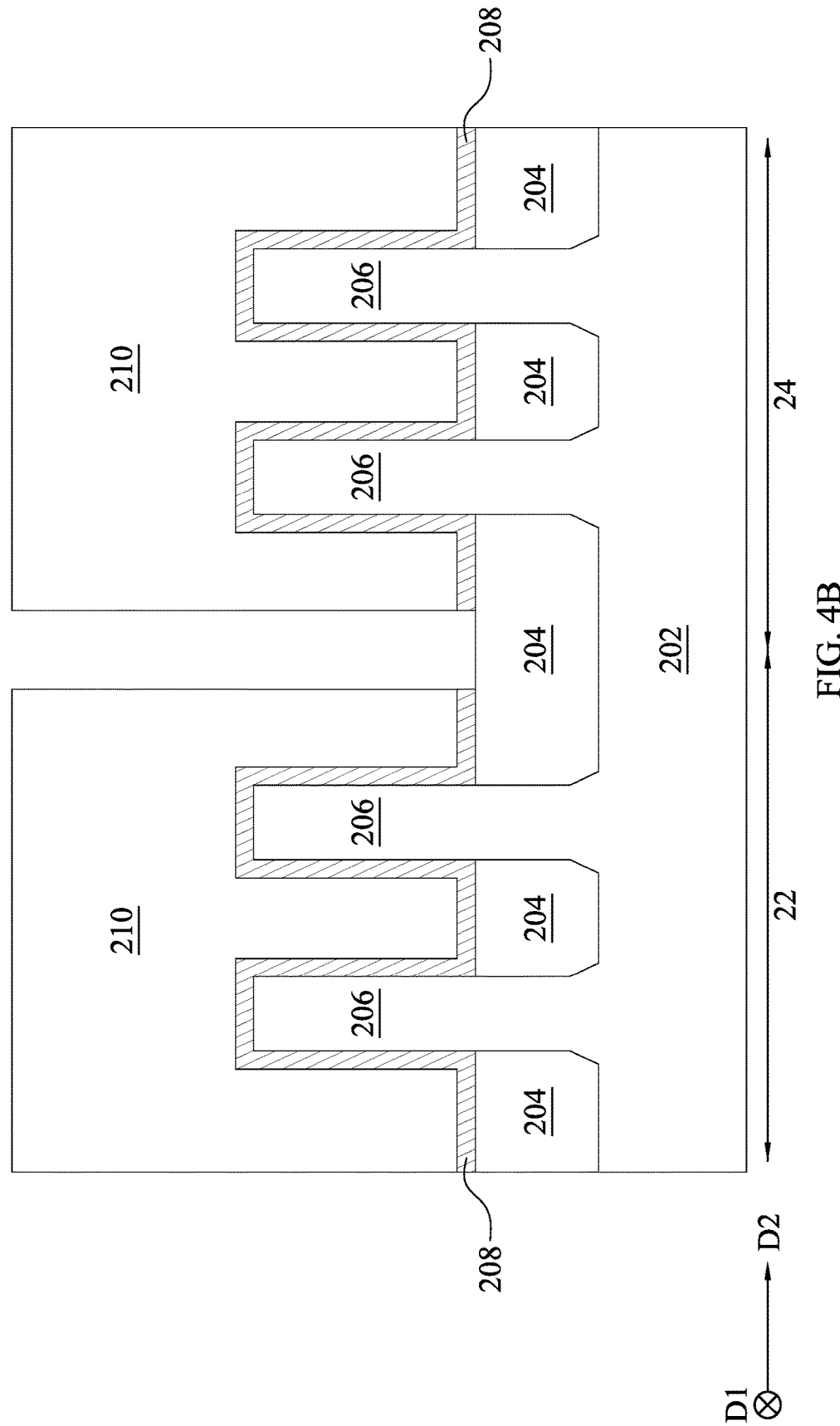
FIGS. 4B, 5B, 6B, 7B, 8B and 9B are different cross-section views of the semiconductor structure of FIGS. 4A, 5A, 6A, 7A, 8A and 9A, respectively, according to aspects of the present disclosure in one or more embodiments.

Referring to FIGS. 4A and 4B, spacers 212 are formed over sidewalls of the sacrificial gate layer 210. In some embodiments, the spacers 212 are made of silicon nitride (SiN), silicon carbide (SiC), SiO, silicon oxynitride (SiON), silicon carbon or any suitable material, but the disclosure is not limited thereto. In some embodiments, the spacers 212 are formed by deposition and etching back operations.

Figure 5A:
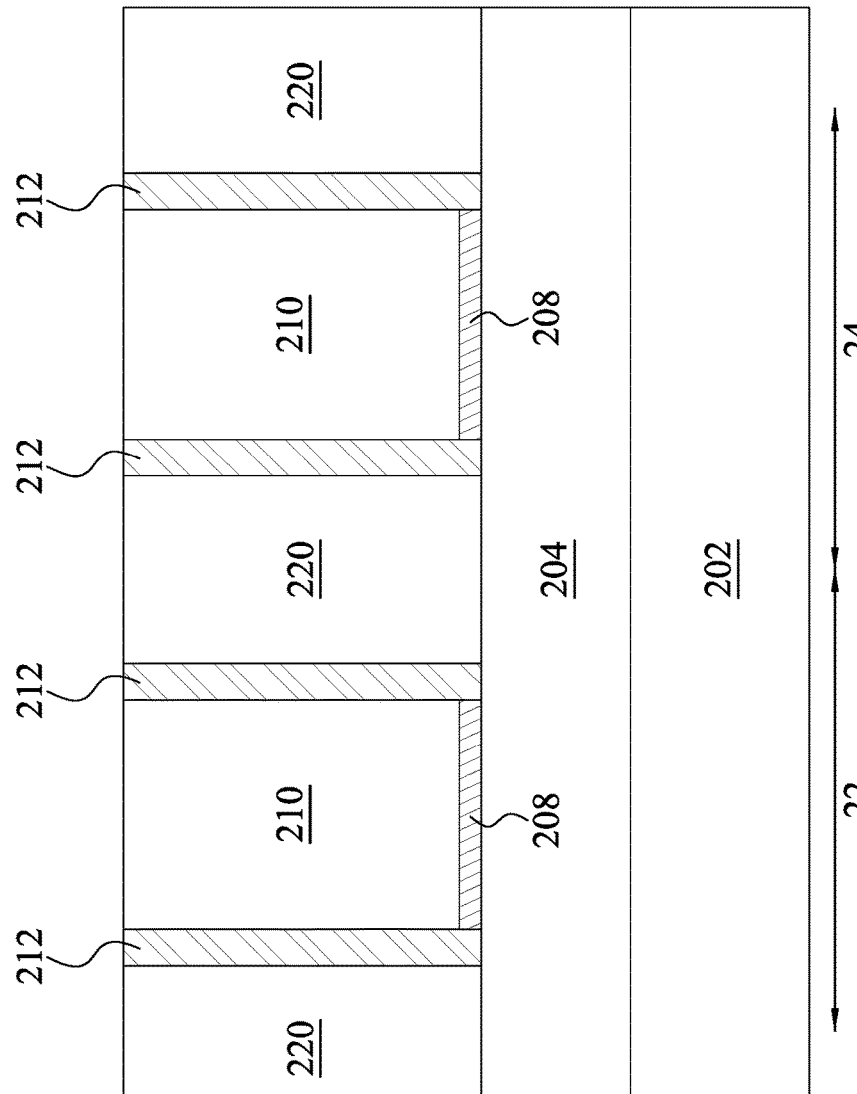
Figure 5B:
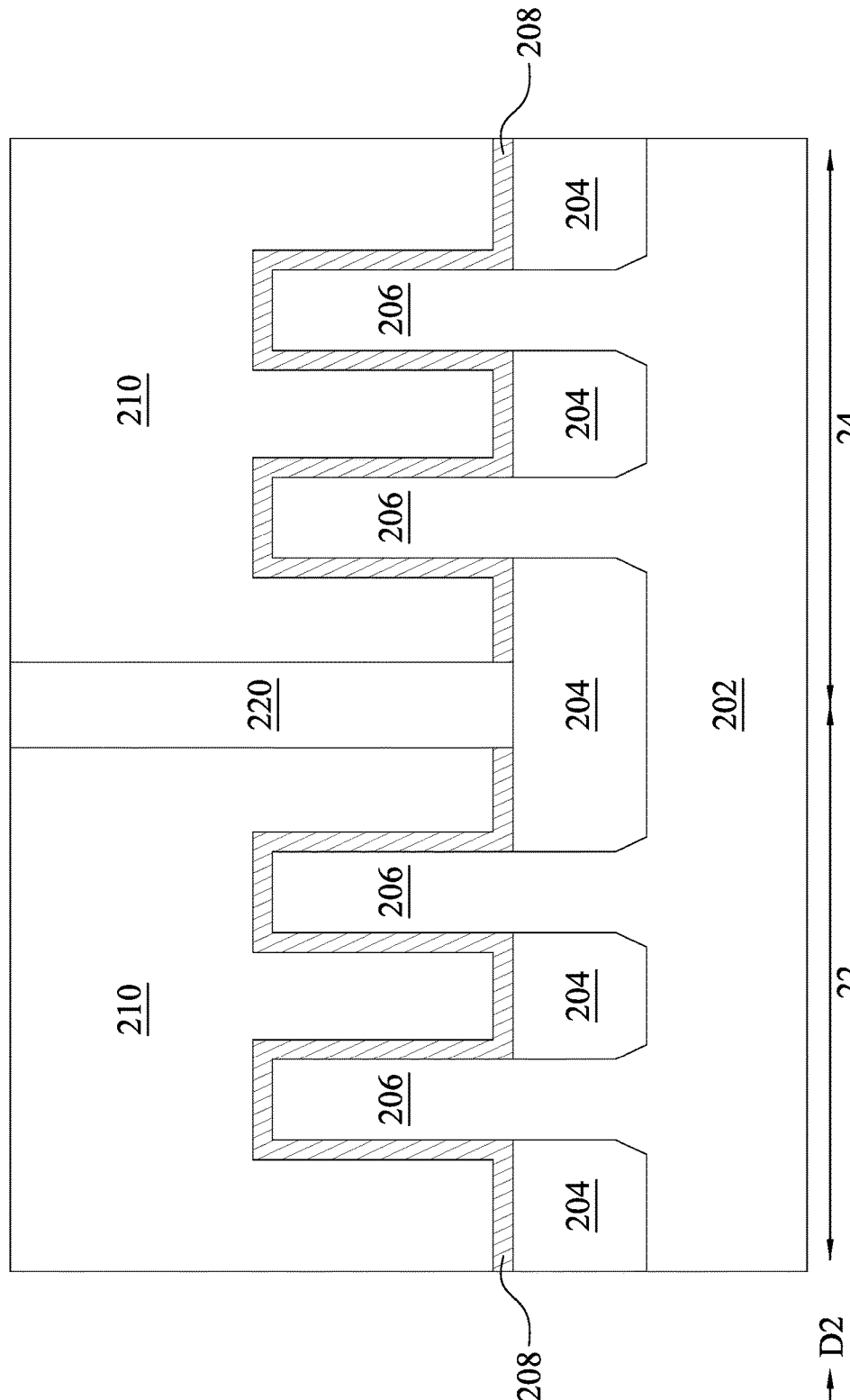

Referring to FIGS. 5A and 5B, a dielectric layer 220 is formed over the substrate 202. The dielectric layer 220 may include dielectric material layers (e.g., an inter-layer dielectric (ILD) layer) formed over the substrate 202 after forming of strained source/drain (S/D) structures (not shown). In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the ILD layer is deposited, a planarization process, such as a chemical mechanical planarization (CMP) operation, may be performed to form the dielectric layer 220. Consequently, the dielectric layer 220 surrounds the sacrificial gate layer 210 and the fin structures 206. In other words, the fin structures 206 and the sacrificial gate layer 210 are embedded in the dielectric layer 220, while a top surface of the sacrificial gate layer 210 remains exposed, as shown in FIG. 5A.

Figure 6B:
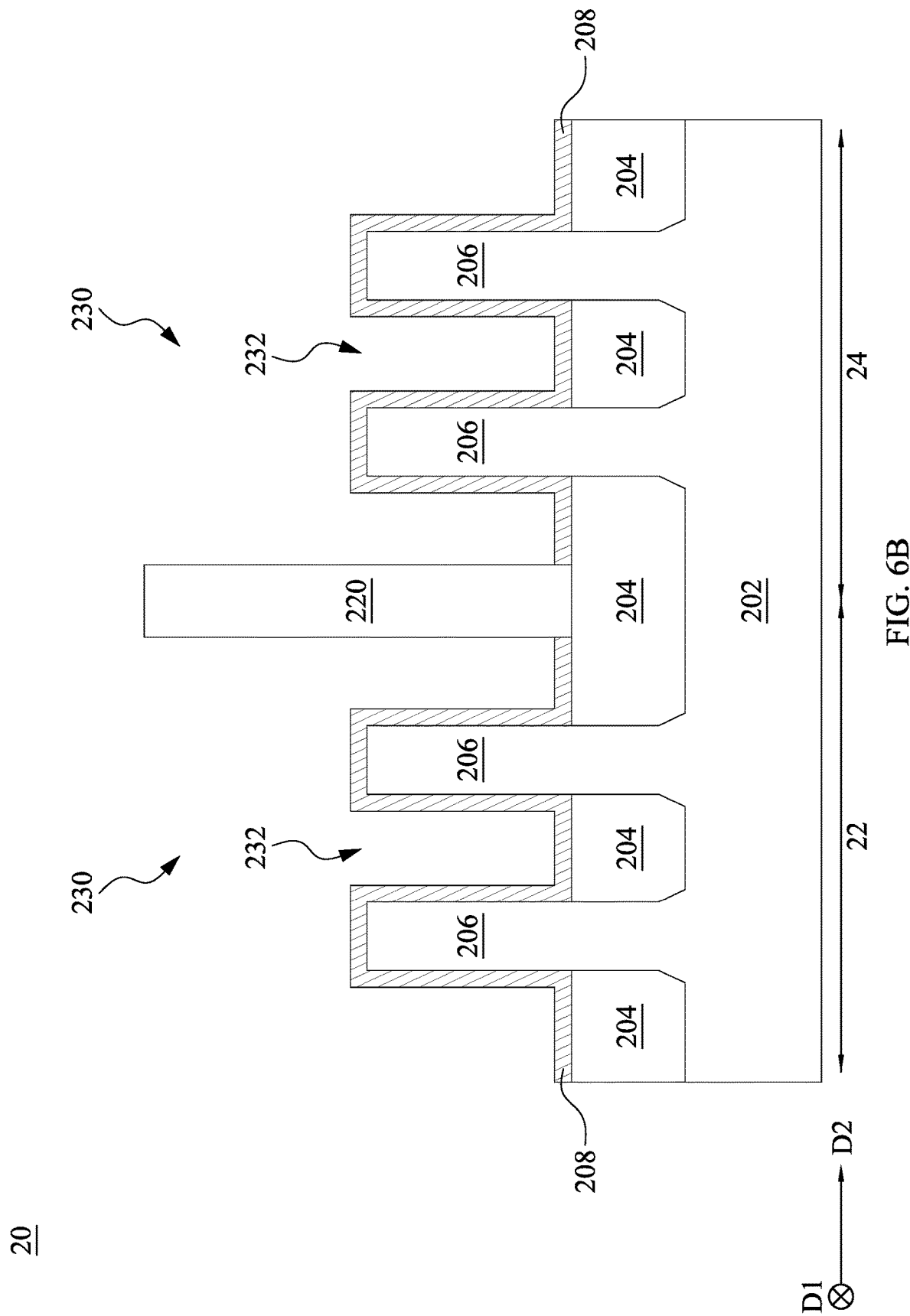

Referring to FIGS. 6A and 6B, the sacrificial gate layer 210 is removed to form gate trenches 230 in the dielectric layer 220. In some embodiments as shown in FIG. 6B, the gate trenches 230 may include gate trenches 232 between two adjacent fin structures 206. In some embodiments, the removal of the remaining sacrificial gate layer 210 includes a dry etching. In some embodiments, the dry etching uses F-containing plasma, Cl-containing plasma and/or B-containing plasma to remove the sacrificial gate layer 210. For example but not limited thereto, the F-containing plasma may include F-containing gas such as $CF_4$, $SF_6$, $CH_2F_2$, $CHF_3$, and/or $C_2F_6$. For example but not limited thereto, the Cl-containing plasma may include Cl-containing gas such as $Cl_2$, $CHCl_3$, $CCl_4$ and/or $BCl_3$. For example but not limited thereto, the Br-containing plasma may include Br-containing gas such as HBr and/or $CHBr_3$. In some embodiments, the removal of the remaining sacrificial gate layer 210 includes a wet etching. In some embodiments, the wet etching uses an ammonium hydroxide ($NH_4OH$) solution. In some embodiments, the patterned dielectric layer 208 may remain substantially intact and still exposed to the gate trench 230 after the removal of the remaining sacrificial gate layer 210.

In some embodiments, the sacrificial gate layer 210 can be replaced with the metal gate structure by operations described in operations 104 to 108, but the disclosure is not limited thereto.

Figure 7A:
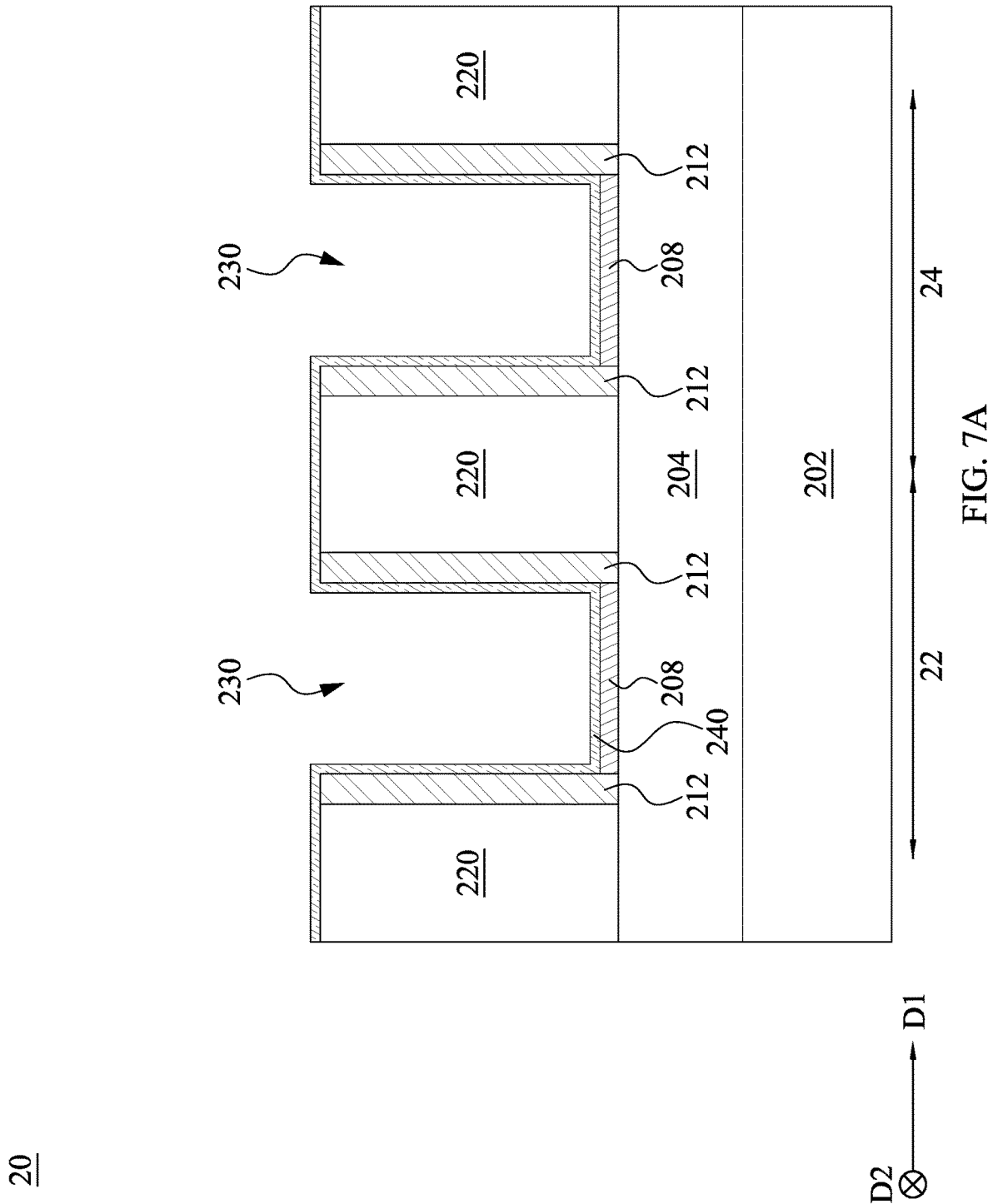
Figure 7B:
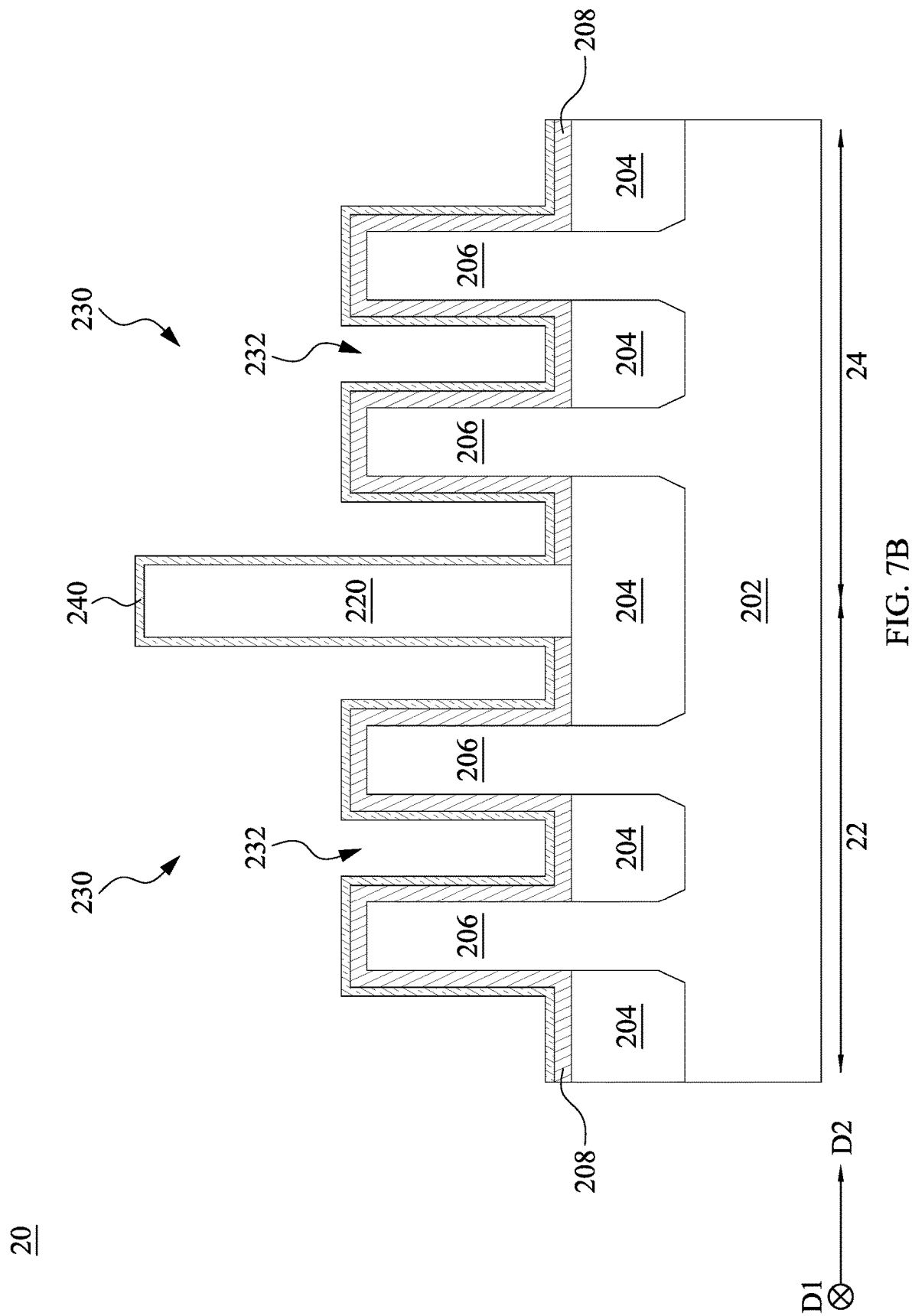

Referring to FIGS. 7A and 7B, a gate dielectric layer 240 is formed over the fins structures 206 according to operation 104. In some embodiments, the gate dielectric layer 240 is conformally formed over the fins structures 206. The gate dielectric layer 240 further covers sidewalls and top surfaces of the fin structures 206 as shown in FIG. 7B. In some embodiments, the gate dielectric layer 240 is conformally formed to cover sidewalls and bottoms of the gate trenches 230 or gate trenches 232. In some embodiments, the gate dielectric layer 240 further covers top surfaces of the spacer 212 and the dielectric layer 220 as shown in FIG. 7A. In some embodiments, the gate dielectric layer 240 includes a high-k dielectric material having a high dielectric constant. The high-k dielectric material may include hafnium dioxide ($HfO_2$), zirconium dioxide ($ZrO_2$), aluminum oxide ($Al_2O_3$), lanthanum oxide ($La_2O_3$), titanium oxide ($TiO_2$), yttrium oxide ($Y_2O_3$), strontium titanate ($SrTiO_3$), hafnium oxynitride ($HfO_xN_y$), hafnium silicate, zirconium silicate, other suitable metal-oxides, metal silicates, or combinations thereof. In some embodiments, a thickness of the gate dielectric layer 240 is within a range of approximately 1 angstrom to approximately 30 angstroms, but the disclosure is not limited thereto.

Figure 8B:
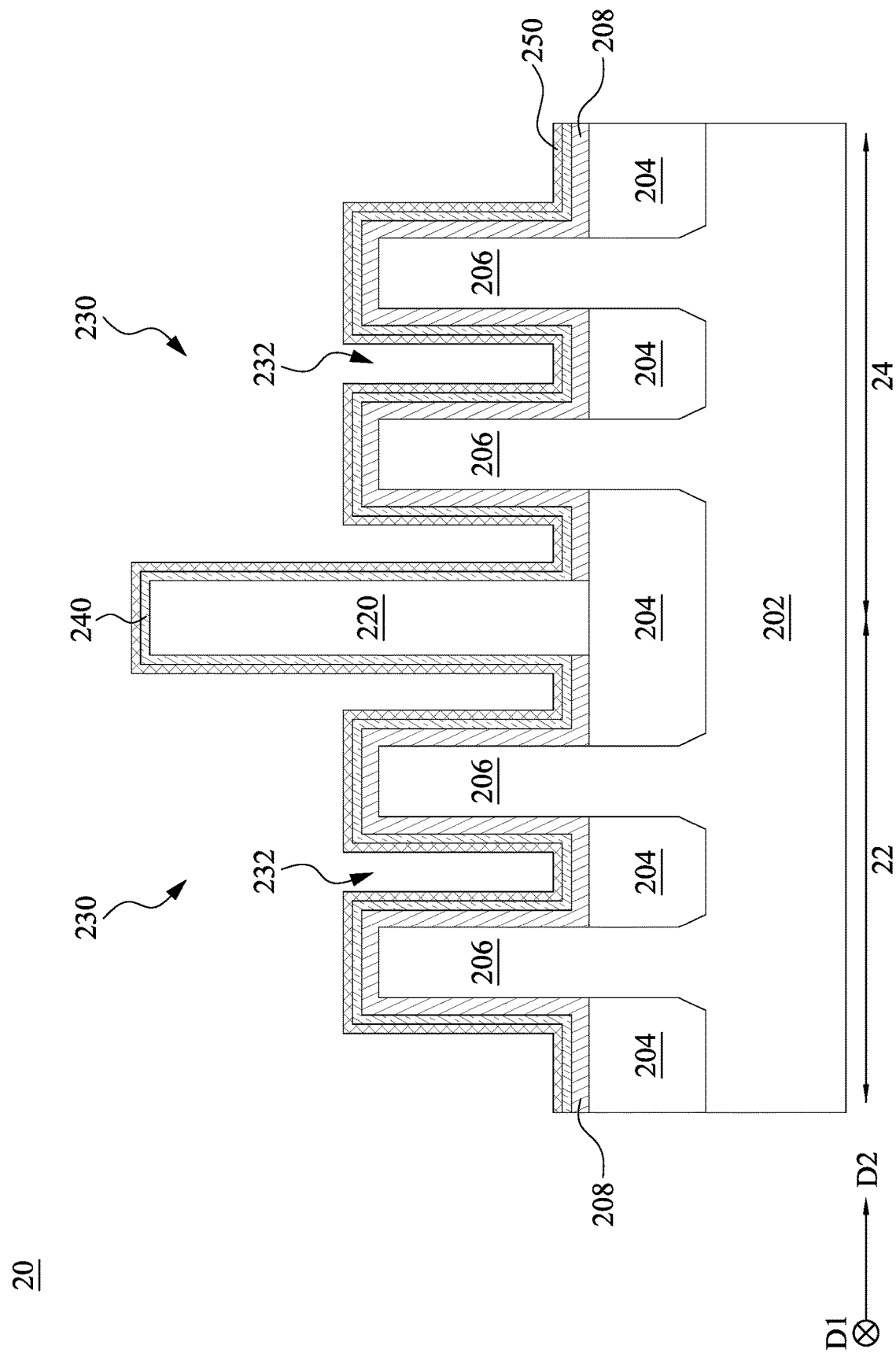

Referring to FIGS. 8A and 8B, a work function material layer 250 is formed over the gate dielectric layer 240 according to operation 106. In some embodiments, the work function material layer 250 is conformally formed over the gate dielectric layer 240. The work function material layer 250 covers sidewalls and top surfaces of the fin structures 206 as shown in FIG. 8B. In some embodiments, the work function material layer 250 includes a work functional metal material. The work functional metal material may include TiN, TaN, WCN, TaAlC, TiC, TaC, Co, Al, TiAl, HfTi, TiSi, TaSi or TiAlC, other suitable metals, or combinations thereof.

Figure 9A:
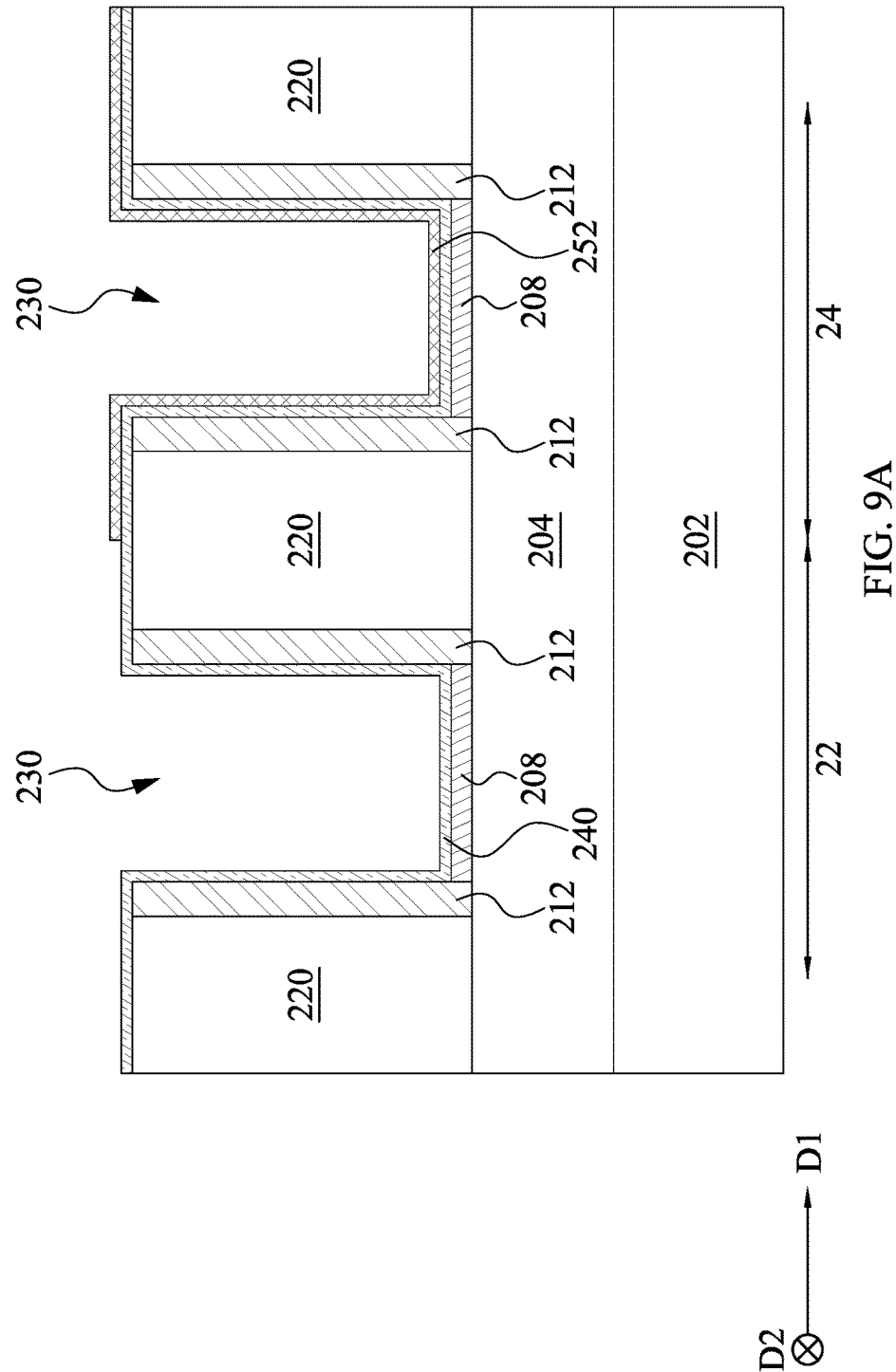
Figure 9B:
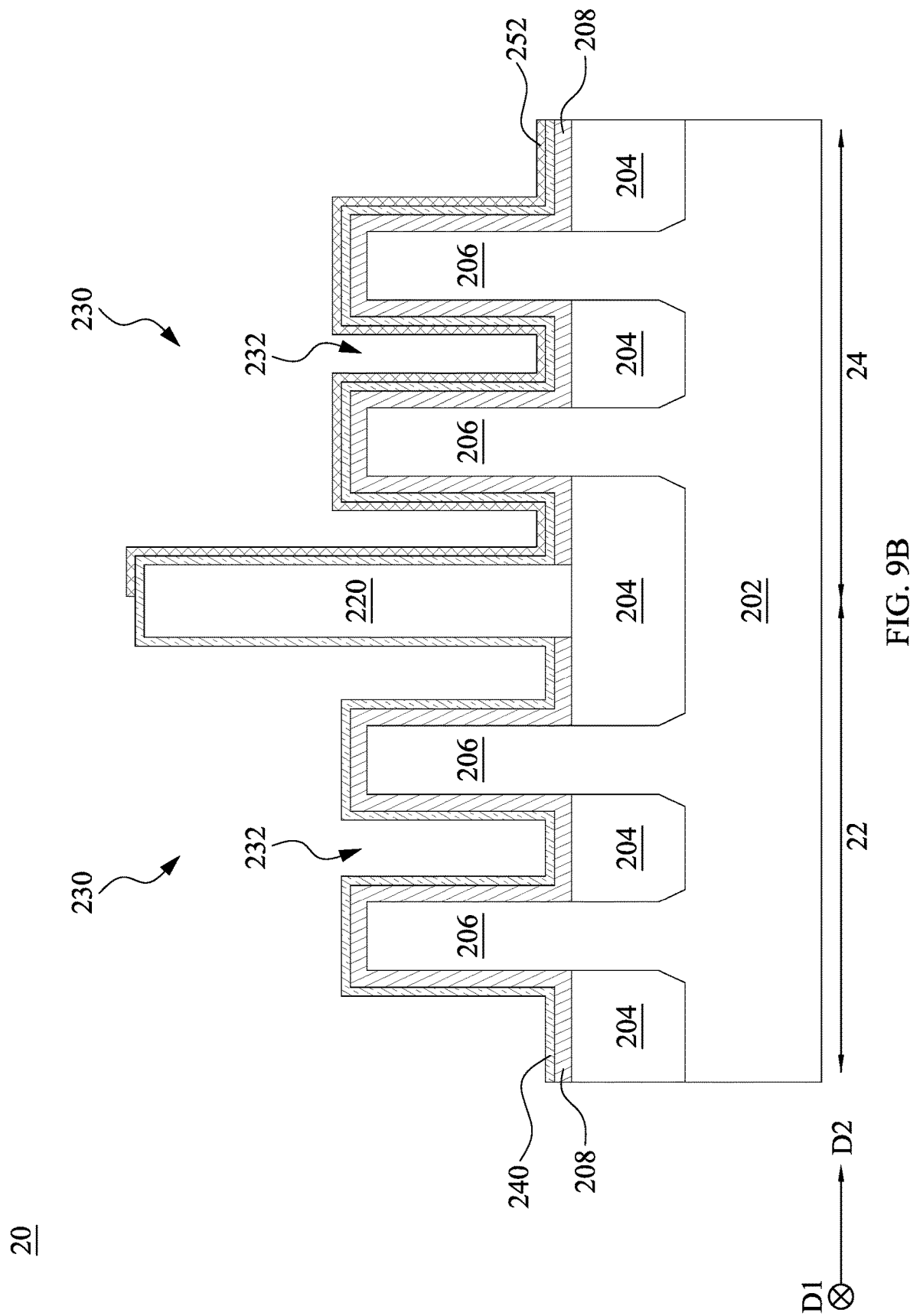

Referring to FIGS. 9A and 9B, the work function material layer 250 is patterned to form a work function layer 252. In some embodiments, a patterned hard mask (not shown) can be formed over the work function material layer 250 for defining a location and a dimension of the work function layer 252. In some embodiments, the patterned hard mask may include silicon nitride (SiN), but the disclosure is not limited thereto. In some embodiments, the work function layer 252 only covers the fin structures 206 of the second device 24. In some embodiments, a thickness of the work function layer 252 is within a range of approximately 1 angstrom to approximately 30 angstroms, but the disclosure is not limited thereto.

In some embodiments, a number of work function layers of the first device 22 is different from that of the second device 24. Depending on design requirements, different number and/or different material of work function layers may be adopted for different devices. For an NMOS device, the work function may be adjusted nearly that of the conduction band of silicon. For a PMOS device, the work function may be adjusted to close to nearly that of the valence band of silicon. The work function layers in different devices can include a single layer of TiN, TaN, TaAlC, TiC, TaC, Co, Al, TiAl, HfTi, TiSi, TaSi or TiAlC, or a multilayer of two or more of these materials, but the disclosure is not limited thereto. For the NMOS device, one or more of TaN, TaAlC, TiN, TiC, Co, TiAl, HfTi, TiSi and TaSi is used as the work function layers, and for the PMOS device, one or more of TiAlC, Al, TiAl, TaN, TaAlC, TiN, TiC and Co is used as the work function layers.

Figure 10A:
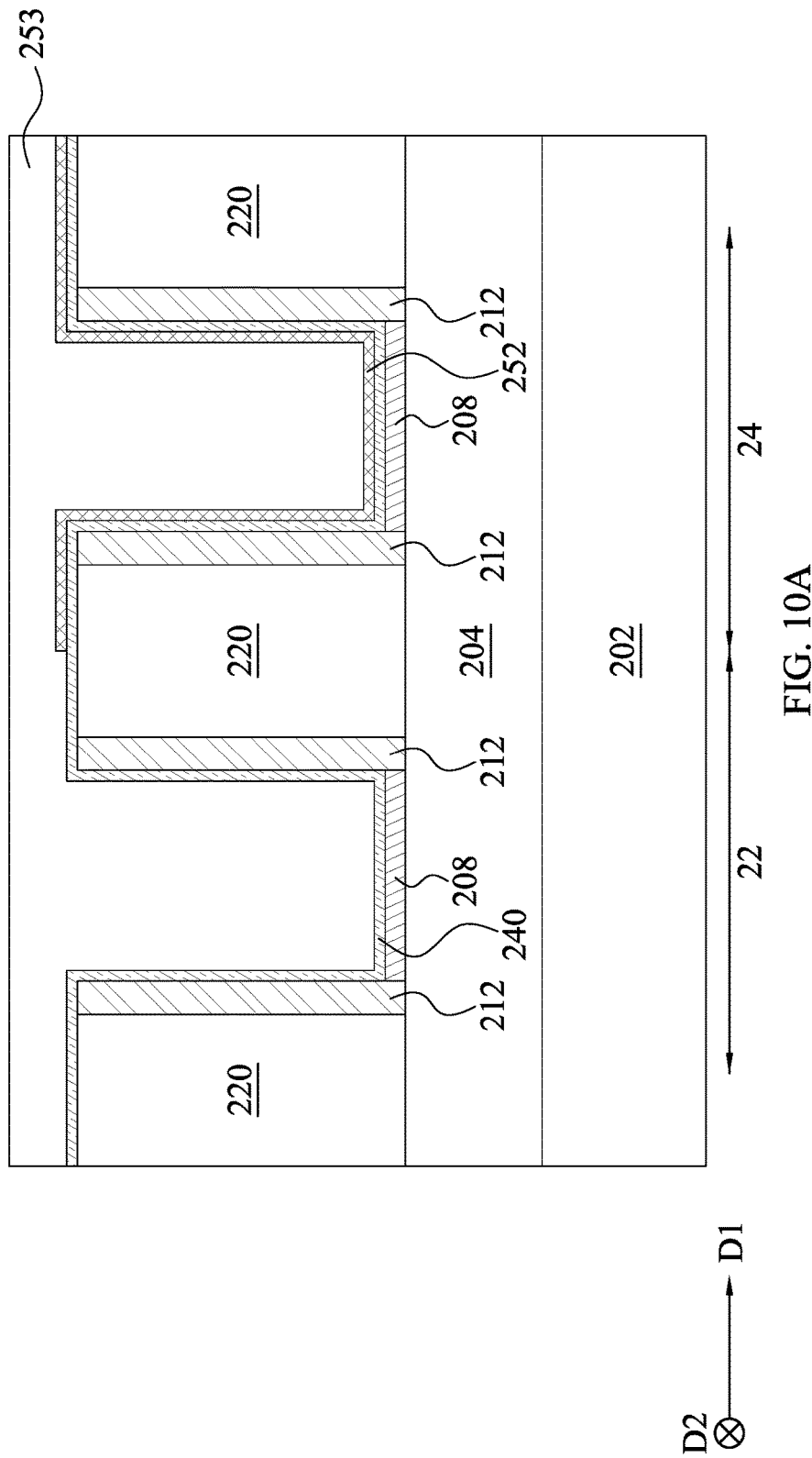
FIGS. 10A, 11A and 12A are cross-sectional views illustrating a semiconductor structure at various fabrication stages subsequent to FIG. 9A according to aspects of the present disclosure in one or more embodiments.
Figure 10B:
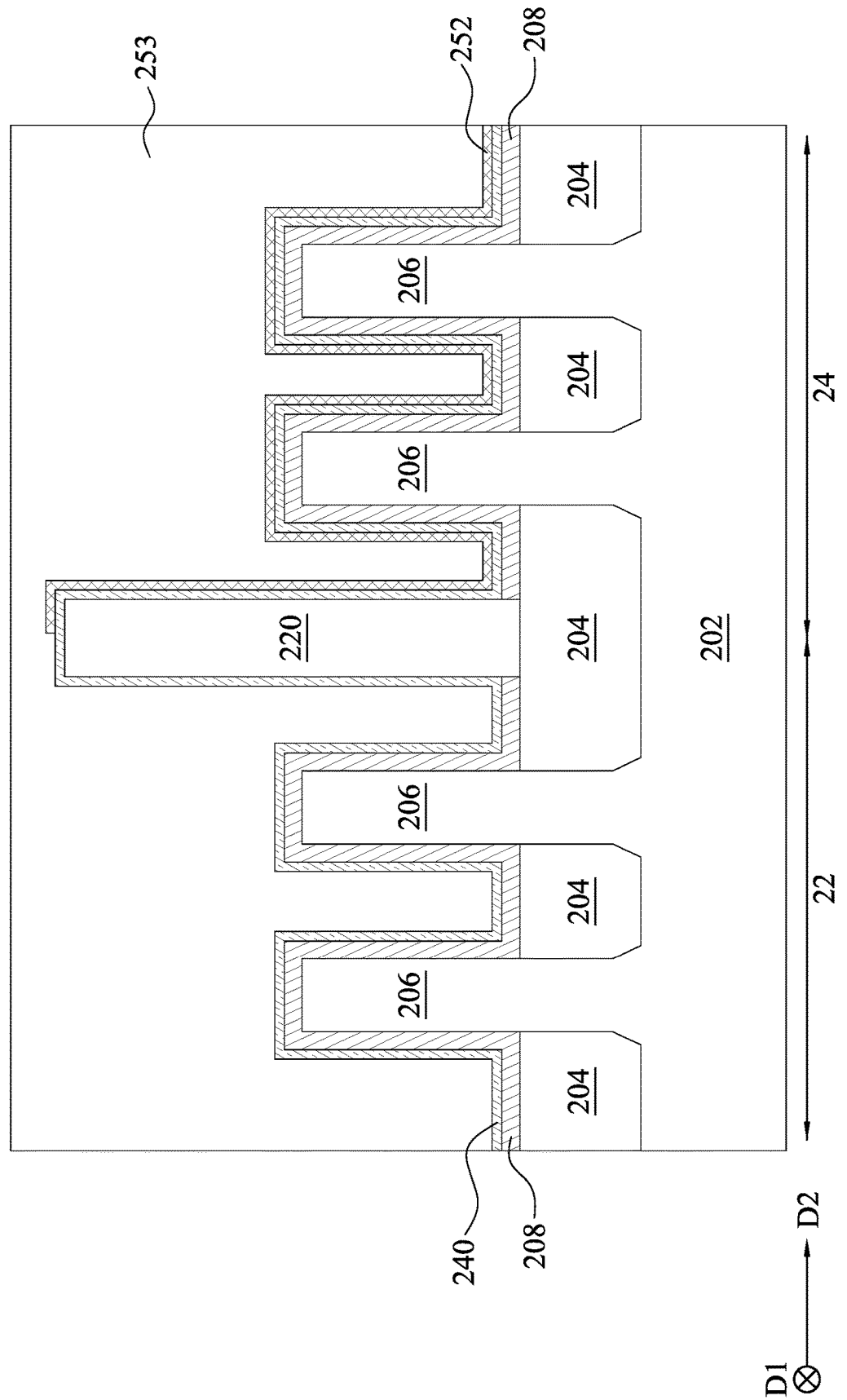
FIGS. 10B, 11B and 12B are different cross-section views of the semiconductor structure of FIGS. 10A, 11A and 12A, respectively, according to aspects of the present disclosure in one or more embodiments.
Figure 11A:
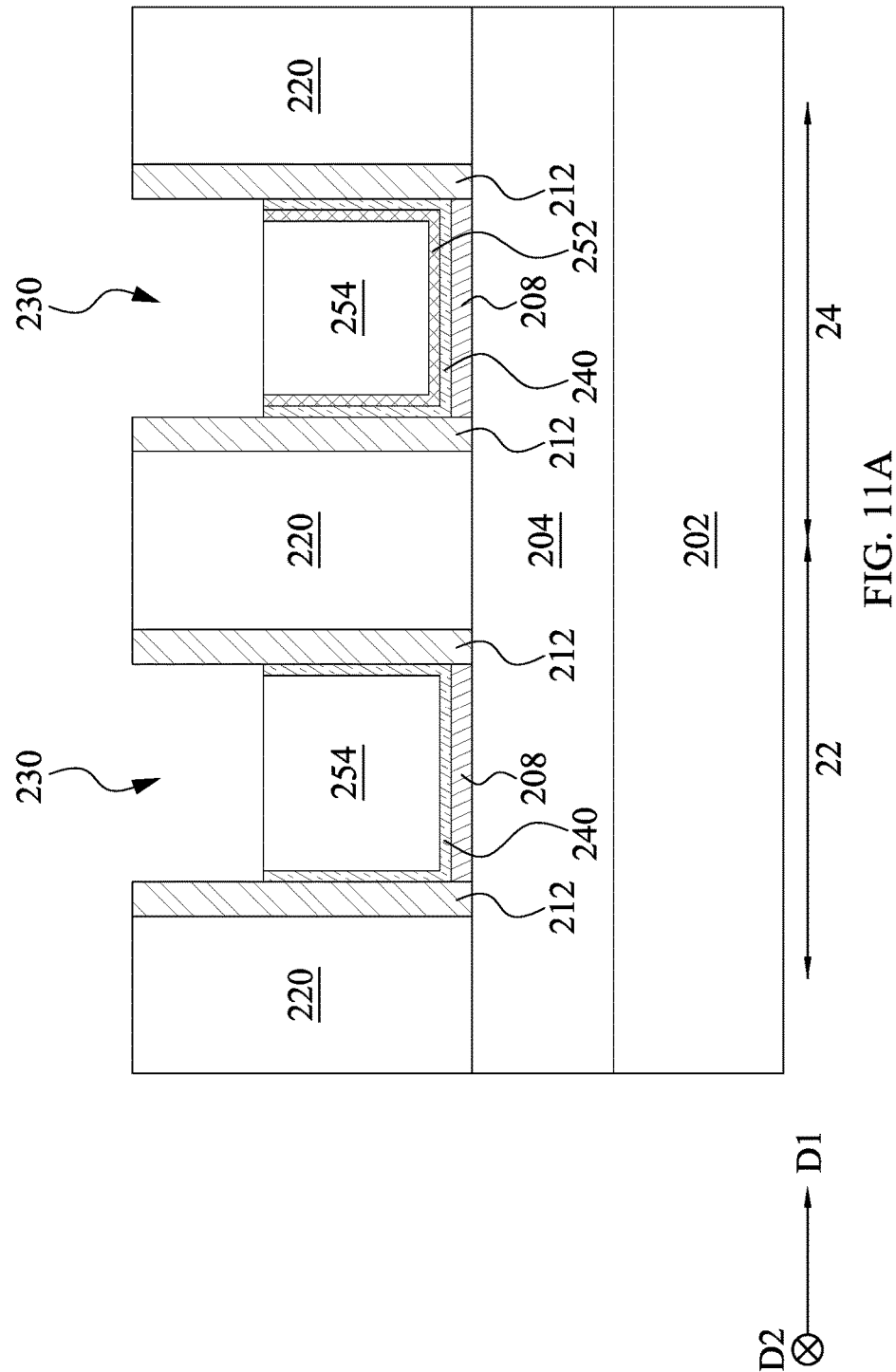
Figure 11B:
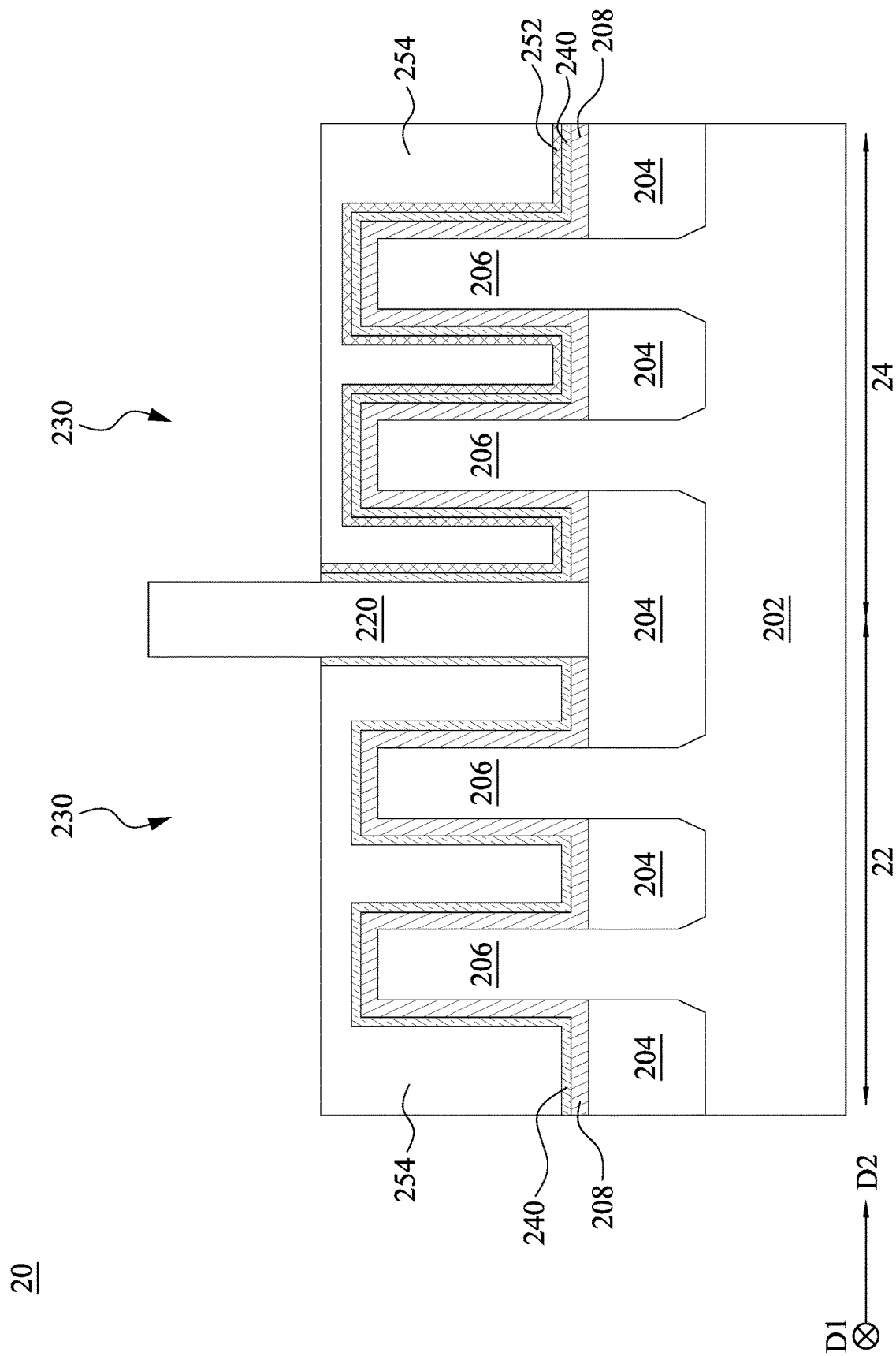
Figure 12A:
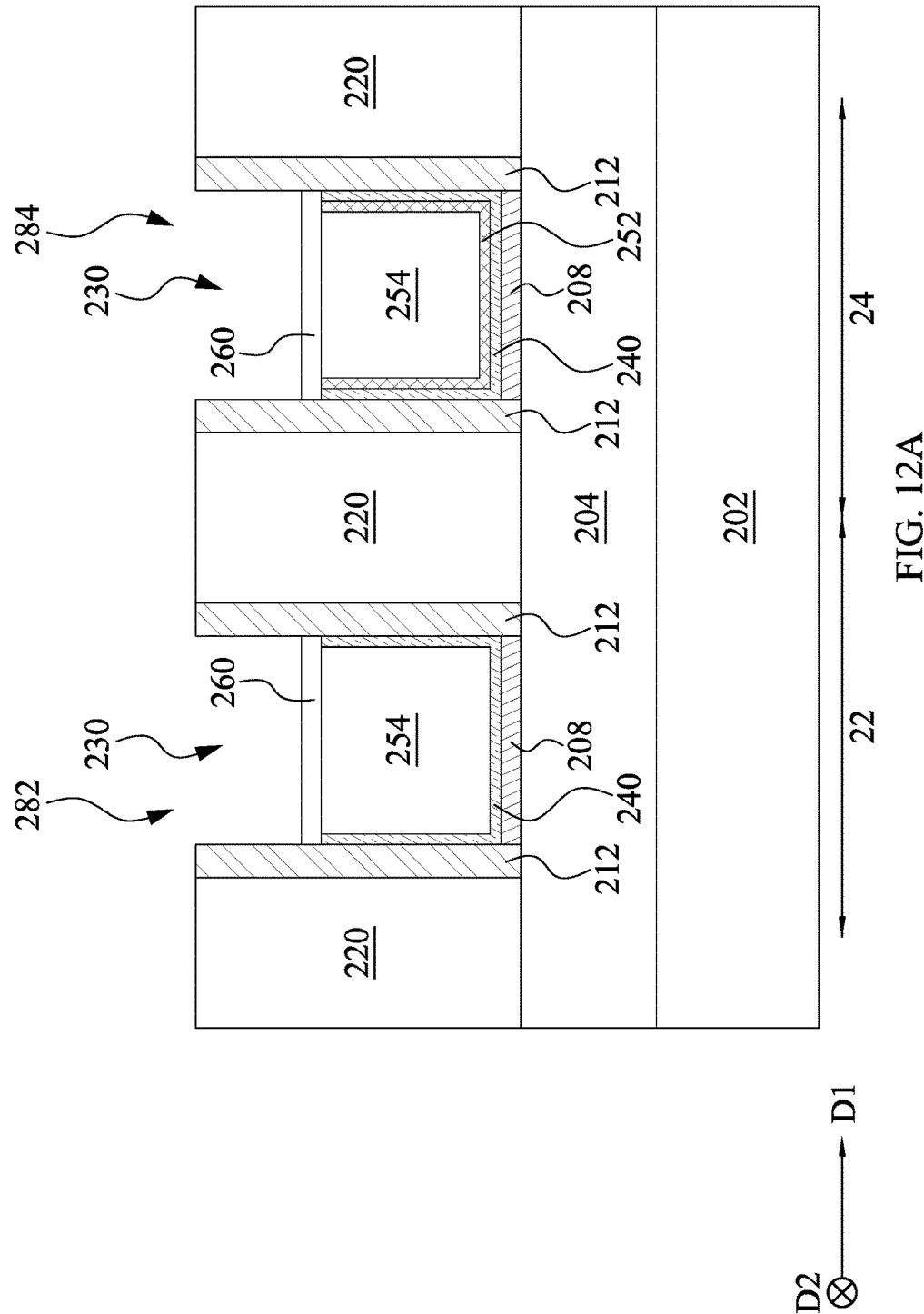
Figure 12B:
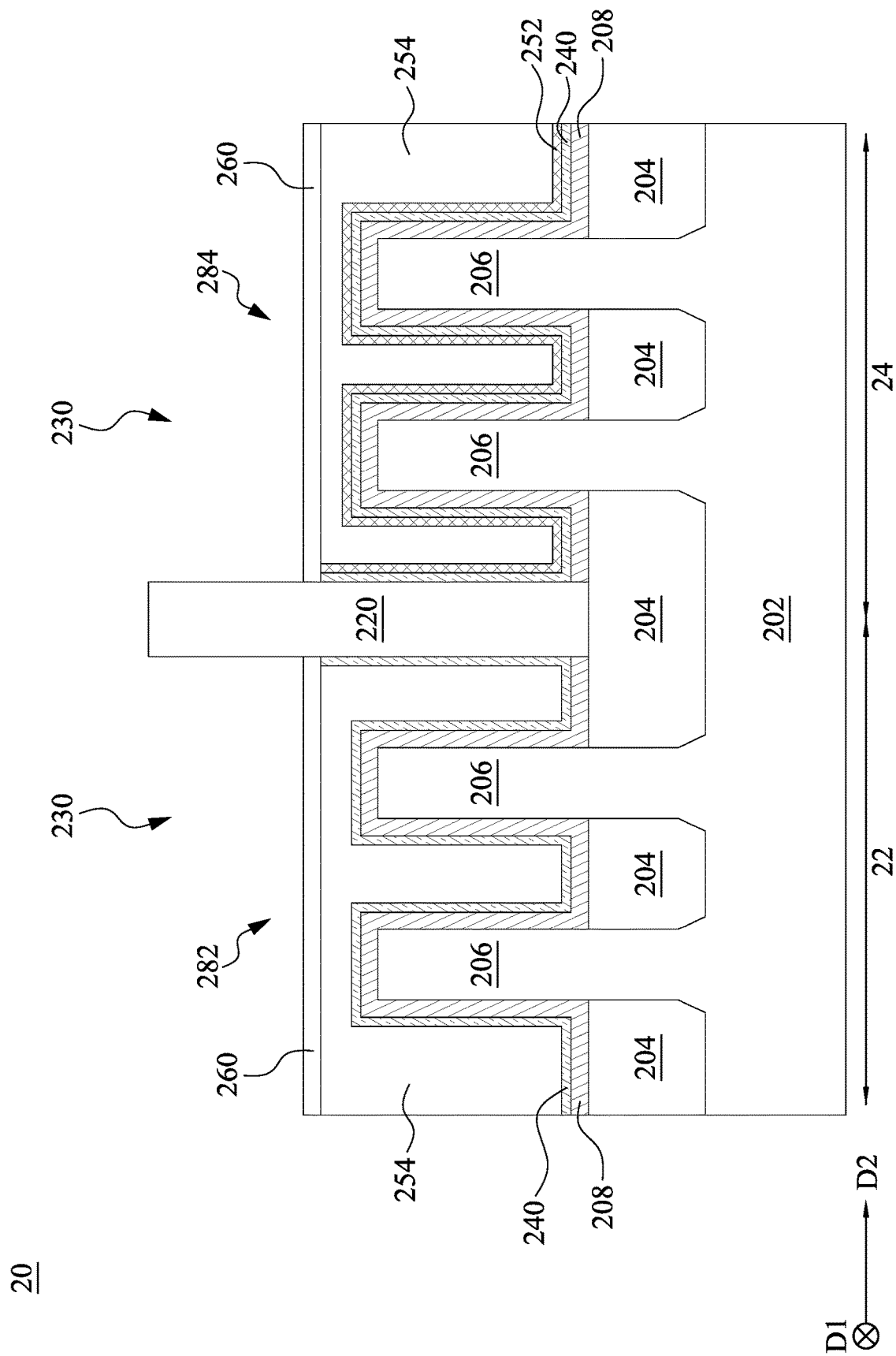

FIGS. 10A, 11A and 12A are cross-sectional views illustrating the semiconductor structure 20 at various fabrication stages subsequent to FIG. 9A according to aspects of the present disclosure in one or more embodiments. FIGS. 10B, 11B and 12B are different cross-section views of the semiconductor structure 20 of FIGS. 10A, 11A and 12A, respectively, according to aspects of the present disclosure in one or more embodiments. In some embodiments as shown in FIGS. 10A and 10B, another work function material layer 253 is formed over the gate dielectric layer 240. In some embodiments, the work function material layer 253 is formed over the gate dielectric layer 240 and the work function layer 252. The gate trenches 230 shown in FIG. 9A may be filled with the work function material layer 253 as shown in FIG. 10A. The gate trenches 232 shown in FIG. 9B between the fin structures 206 may be filled with the work function material layer 253 as shown in FIG. 10B. As shown in FIG. 10B, the work function material layer 253 covers the top surfaces of the fin structures 206. In some embodiments, the work function material layer 253 may include a work functional metal material different from the work function material layer 250.

Referring to FIGS. 11A and 11B, after the work function material layer 253 is deposited, a planarization process, such as a chemical mechanical planarization (CMP) operation, may be performed. Consequently, portions of the work function material layer 253, the work function layer 252 and the gate dielectric layer 240 over the dielectric layer 220 may be removed. In other words, top surfaces of the dielectric layer 220 and the spacers 212 are exposed after the planarization process. Subsequent to the planarization process, an etching process, such as a wet etching or a dry etching operation, may be performed to form the work function layer 254. The etching process may be performed to remove portions of the work function material layer 253, the work function layer 252 and the gate dielectric layer 240 in the gate trenches 230. In some embodiments, the work function material layer 253, the work function layer 252 and the gate dielectric layer 240 are etched to a depth where the top surfaces of remaining portions of the work function material layer 253 (e.g., the work function layer 254), the work function layer 252 and the gate dielectric layer 240 are substantially higher than the top surfaces of the fin structures 206 as shown in FIG. 11B. In some embodiments, at least a portion of the work function layer 254 is located between the fin structures 206, and a top surface of the portion is higher than the top surfaces of the fin structures 206. In some embodiments, a thickness of the work function layer 254 is within a range of approximately 1 angstrom to approximately 30 angstroms, but the disclosure is not limited thereto.

Referring to FIGS. 12A and 12B, a contact layer 260 is formed over the work function layer 254 according to operation 108. In some embodiments, the contact layer 260 is selectively formed over the work function layer 254. In other words, the contact layer 260 is only disposed in the gate trenches 230, while the top surfaces of the dielectric layer 220 and the spacers 212 remain exposed. Since the gate trenches 232 between the fin structures 206 are filled with the work function layer 254, the gate trenches 232 is separated from the contact layer 260 by the work function layer 254. In other words, the gate trenches 232 between the fin structures 206 are free of the contact layer 260.

In some embodiments, the contact layer 260 can include conductive material such as metal. Examples of metal materials may be, for example but not limited thereto, Al, Cu, AlCu, or W. In some embodiments, the materials of the contact layer 260, the work function layer 254, and the work function layer 252 are different. In some embodiments, the work function layer 254 and the work function layer 252 are configured to adjust a triggered voltage of the first device 22 and/or the second device 24 in the semiconductor structure 20. In some embodiments, the contact layer 260 is configured to transmit electrical signals. In some embodiments, a resistance of the contact layer 260 is lower than a resistance of the work function layer 254. In some embodiments, the resistance of the contact layer 260 is lower than a resistance of the work function layer 252. In some embodiments, a resistance of a region between the fin structures 206 is greater than a resistance of a region above the fin structures 206.

In some embodiments as shown in FIG. 12A, the contact layer 260 contacts sidewalls of the spacers 212. In some embodiments, a top surface of the contact layer 260 and a top surface of the dielectric layer 220 are at different levels. In some embodiments as shown in FIG. 12B, the contact layer 260 is separated from the gate trenches 232 by the work function layer 254. In some embodiments, a bottom surface of the contact layer 260 is higher than the top surfaces of the fin structures 206. In some embodiments, the contact layer 260 contacts a sidewall of the dielectric layer 220. As shown in FIGS. 12A and 12B, the contact layer 260 is not between the fin structures 206. Because the gate trenches 232 between the fin structures 206 are filled with the work function layer 254 and are free of the contact layer 260, the triggered voltage instability issue can be mitigated.

In some embodiments, the first device 22 includes a first gate structure 282. The first gate structure 282 includes the gate dielectric layer 240, the work function layer 254 and the contact layer 260. In some embodiments, the second device includes a second gate structure 284. The second gate structure 284 includes the gate dielectric layer 240, the work function layers 252, 254 and the contact layer 260. In some embodiments, each of the gate trenches 230 may have a wider opening and a smaller bottom. In some embodiments, the wider openings of the gate trenches are higher than the fin structures 206. In some embodiments, the contact layers 260 of the first gate structure 282 or the second gate structure 284 may be disposed in the wider openings of the gate trenches 230.

The semiconductor structure 20 may undergo further processes to form various features such as source/drain structures, contacts/vias, interconnect metal layers, dielectric layers, passivation layers, etc. In some embodiments, a gate via (not shown) may be formed over the contact layer 260 according to operation 110. In some embodiments, the gate via directly contacts the contact layer 260. In some embodiments, the gate via is separated from the work function layer 254 by the contact layer 260. In some embodiments, a bottom surface of the gate via is lower than the top surface of the dielectric layer 220. In some embodiments, a bottom surface of the gate via is higher than the top surfaces of the fin structures 206. In some embodiments, a portion of the gate via is disposed in the gate trenches 230.

The structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 13A:
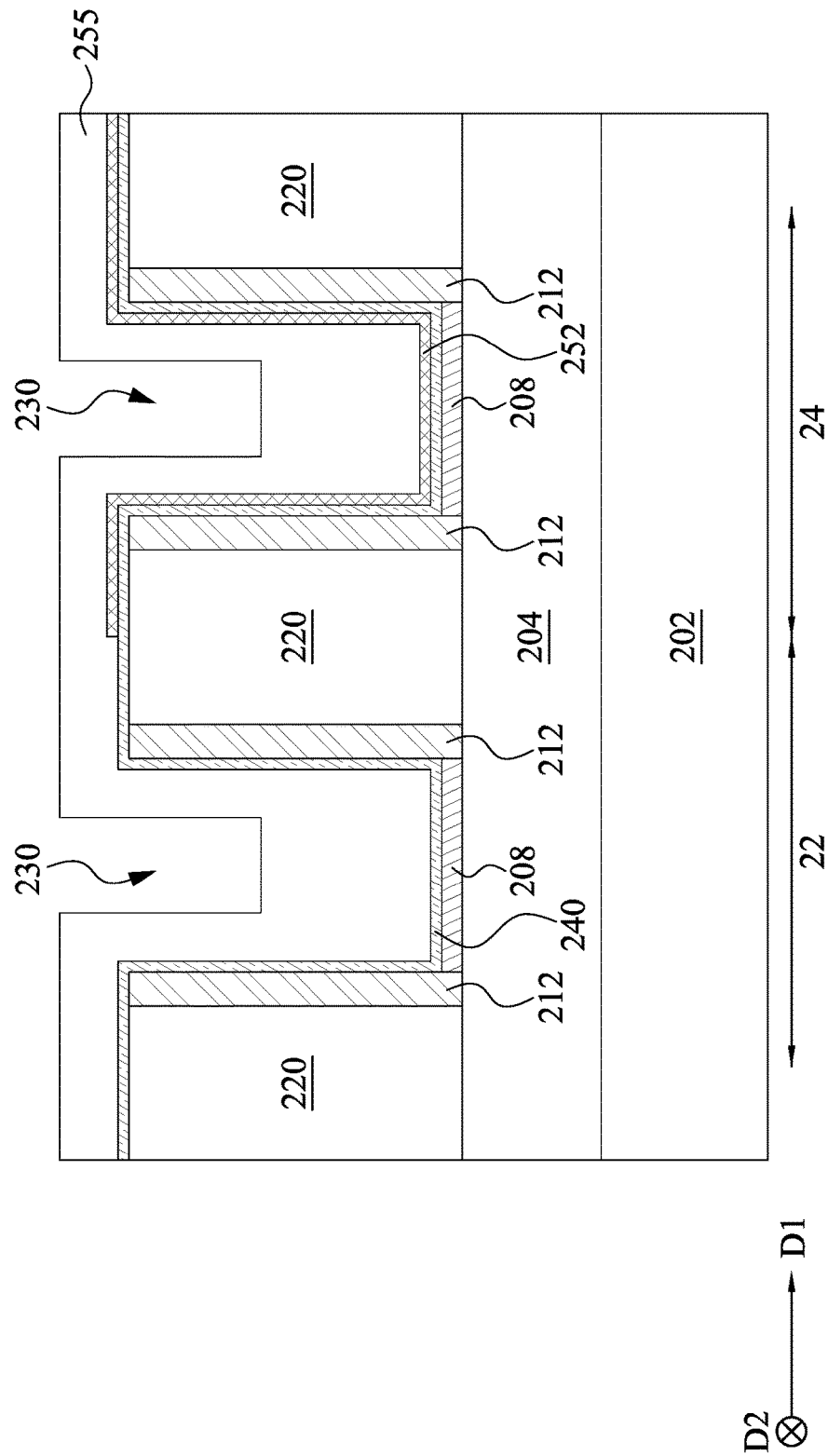
FIGS. 13A, 14A and 15A are cross-sectional views illustrating a semiconductor structure at various fabrication stages subsequent to FIG. 9A according to aspects of the present disclosure in one or more embodiments.
Figure 13B:
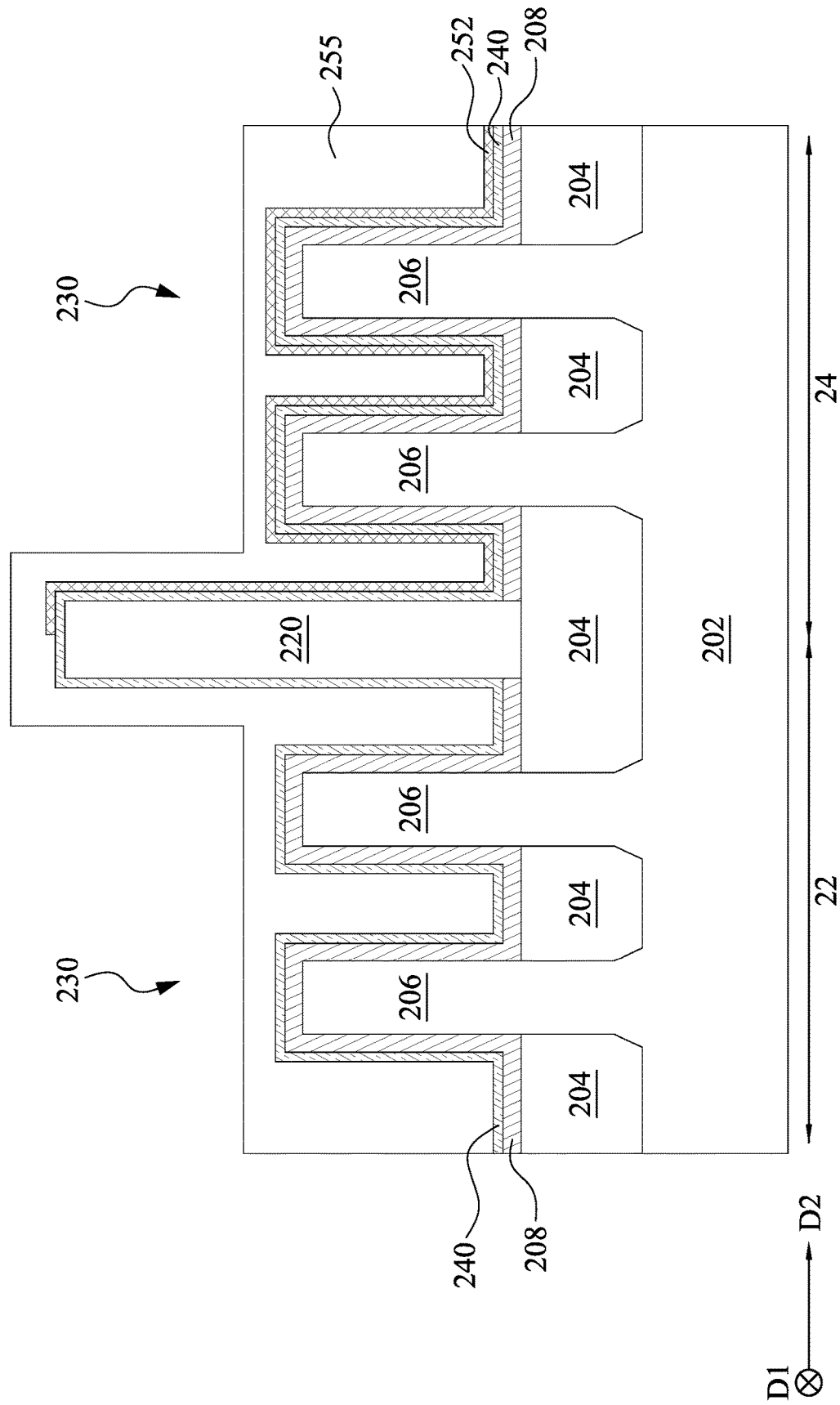
FIGS. 13B, 14B and 15B are different cross-section views of the semiconductor structure of FIGS. 13A, 14A and 15A, respectively, according to aspects of the present disclosure in one or more embodiments.
Figure 14A:
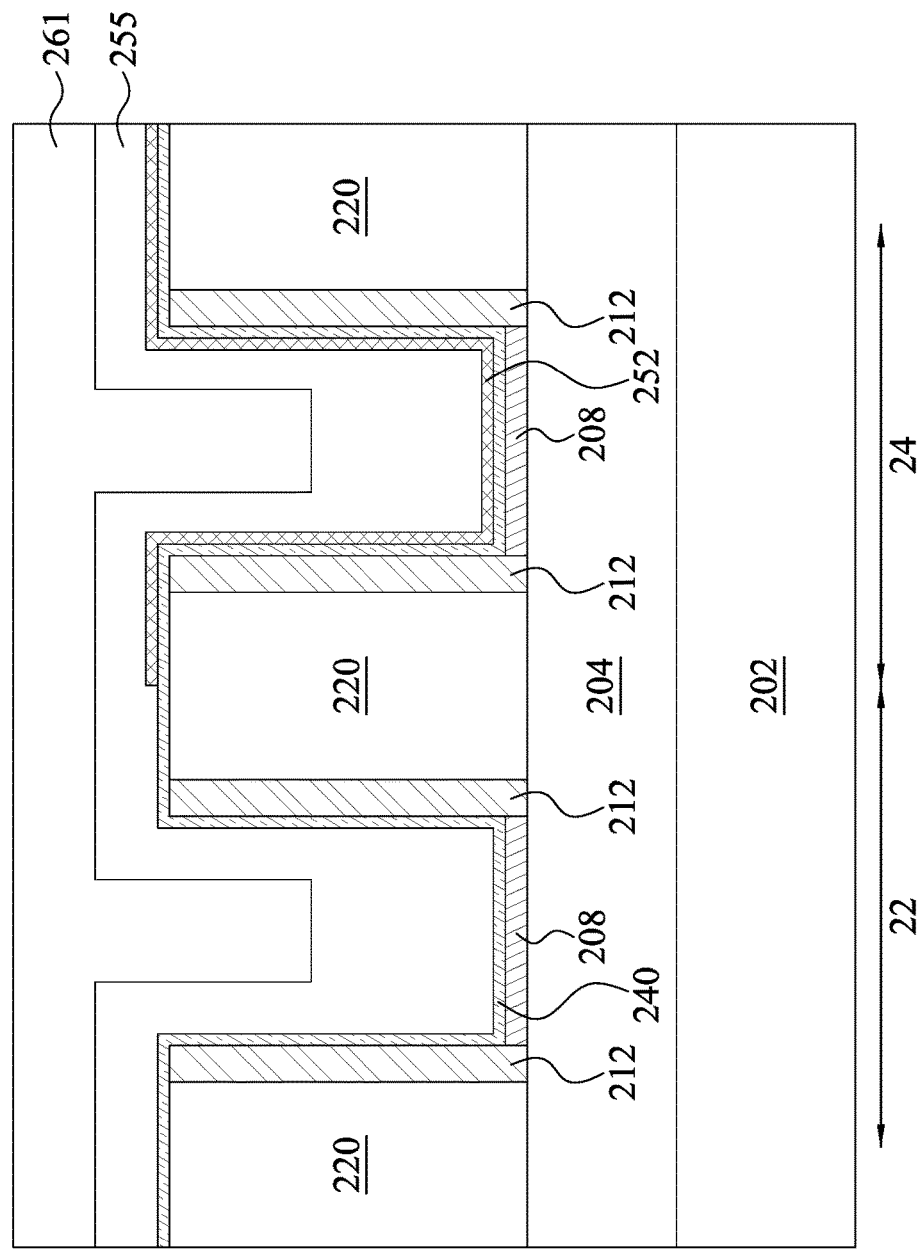
Figure 14B:
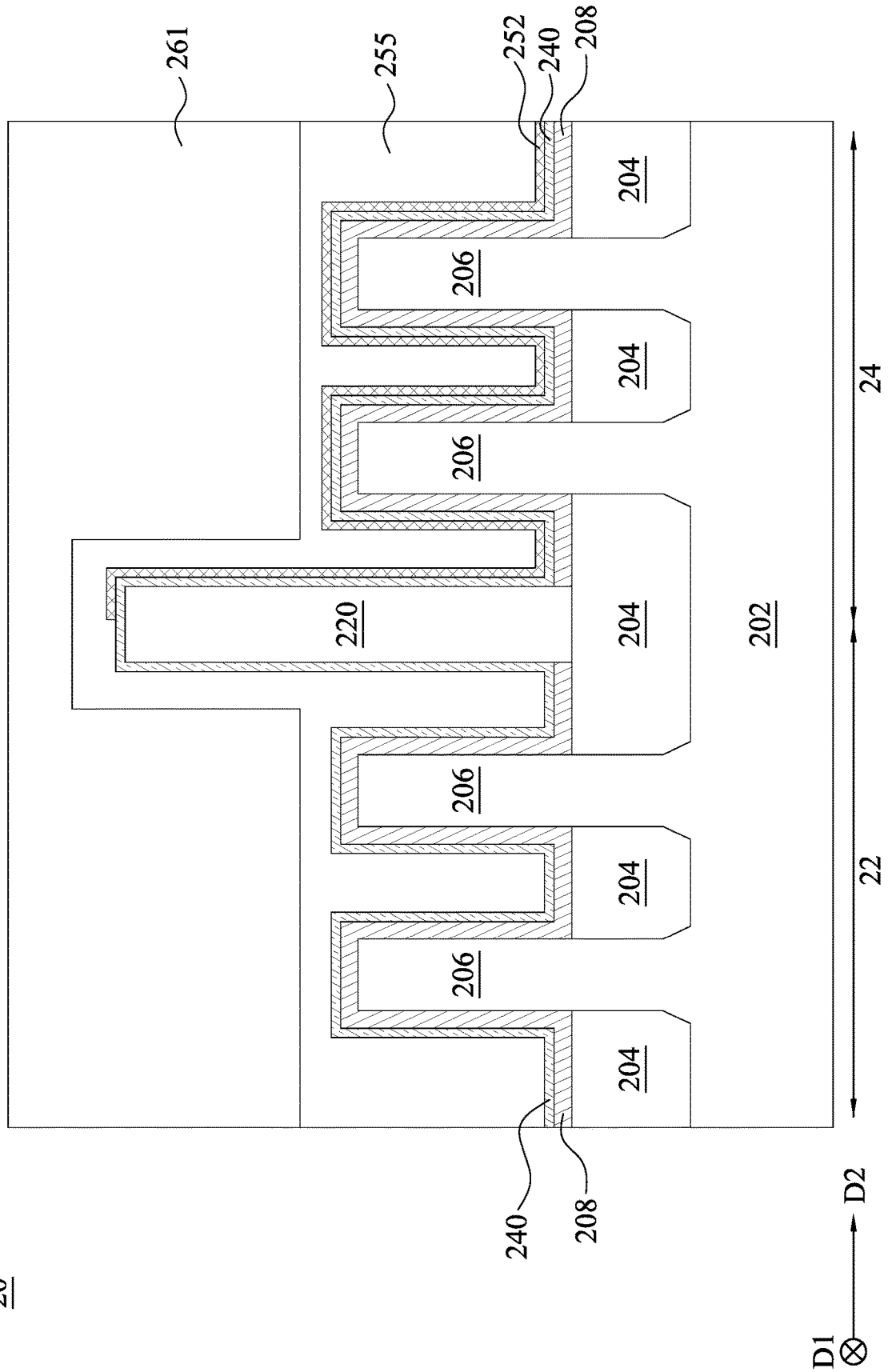
Figure 15A:
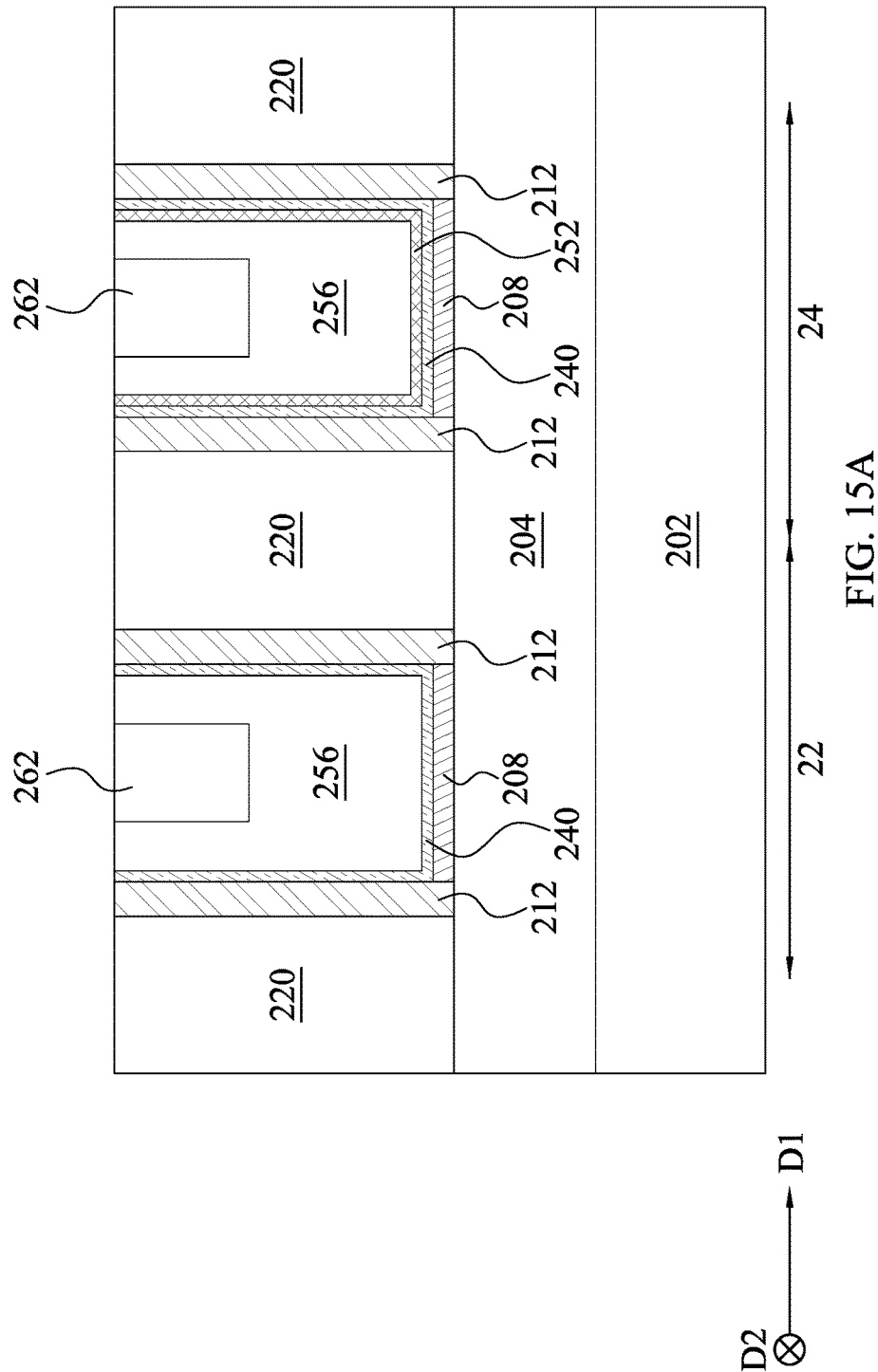
Figure 15B:
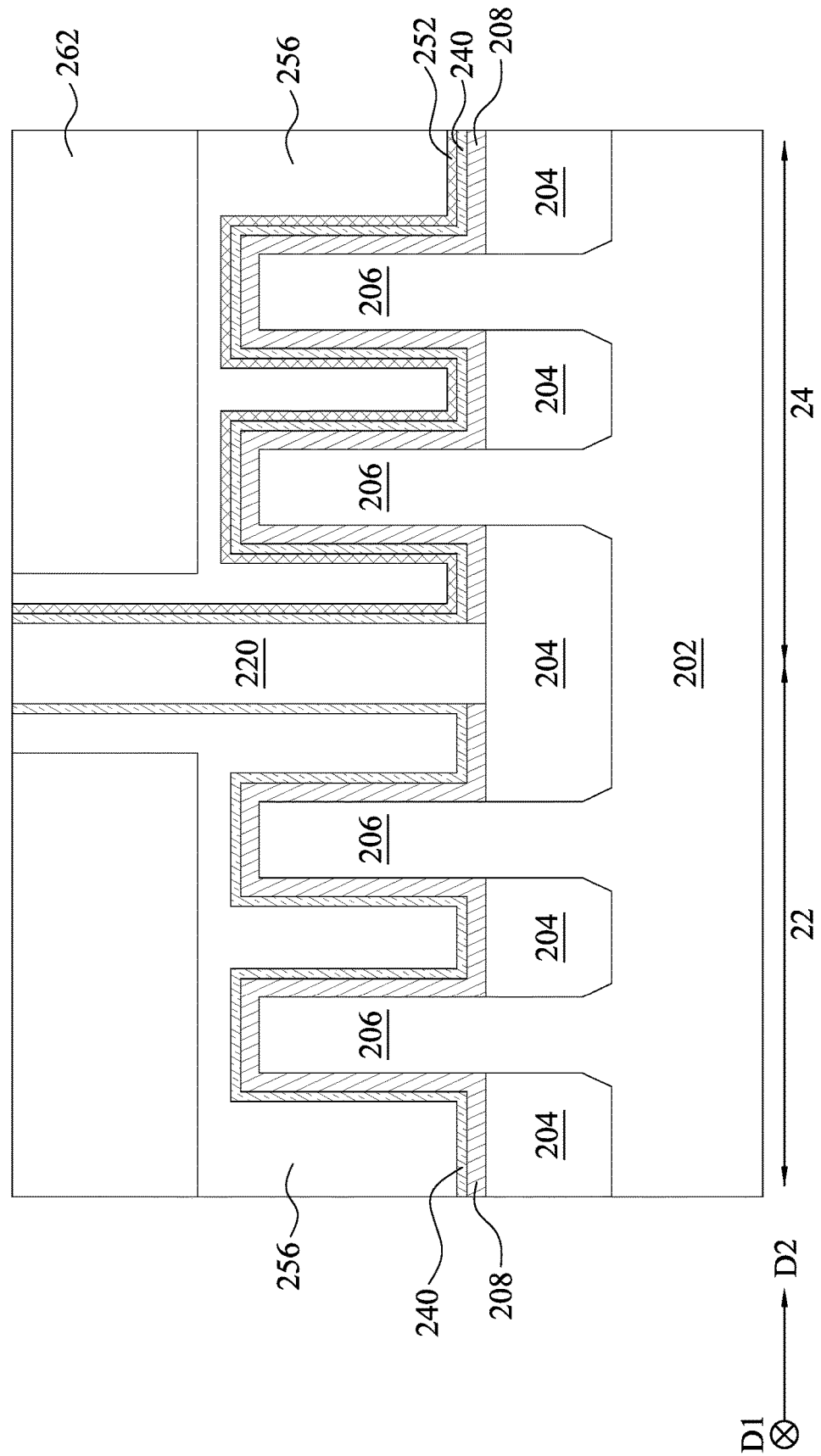

FIGS. 13A, 14A and 15A are cross-sectional views illustrating the semiconductor structure 20 at various fabrication stages subsequent to FIG. 9A according to aspects of the present disclosure in one or more embodiments. FIGS. 13B, 14B and 15B are different cross-section views of the semiconductor structure 20 of FIGS. 13A, 14A and 15A, respectively, according to aspects of the present disclosure in one or more embodiments. In some embodiments as shown in FIGS. 13A and 13B, a work function material layer 255 is formed over the gate dielectric layer 240 and the work function layer 252. In some embodiments, the work function material layer 255 is conformally formed over the gate dielectric layer 240 and the work function layer 252. The gate trenches 230 shown in FIG. 9A may be filled with the work function material layer 255 as shown in FIG. 13A, but a portion of the gate trenches 230 is not filled with the work function material layer 255. The gate trenches 232 shown in FIG. 9B between the fin structures 206 may be filled with the work function material layer 255 as shown in FIG. 13B. In some embodiments, at least a portion of the work function material layer 255 is disposed over the fin structures 206. Further, a portion of the work function material layer 255 is formed conformally with the gate dielectric layer 240 or the work function layer 252. In some embodiments, the work function material layer 255 may have a work functional metal material different from the work function layer 252.

Referring to FIGS. 14A and 14B, a contact material layer 261 is formed over the work function material layer 255 according to operation 108. In some embodiments, the contact material layer 261 is formed over the work function material layer 255 by deposition operations. As shown in FIG. 14A, part of the contact material layer 261 may be formed in the gate trenches 230 since the gate trenches 230 between the spacers 212 are not filled up with the work function material layer 255. As shown in FIG. 14B, the gate trenches 232 are free of the contact material layer 261 since the gate trenches 232 between the fin structures 206 are filled up with the work function material layer 255. In some embodiments, the contact material layer 261 can include conductive material such as Al, Cu, AlCu, or W, but is not limited to the above-mentioned materials.

Referring to FIGS. 15A and 15B, after the work function material layer 255 and the contact material layer 261 are deposited, a planarization process, such as a CMP operation, may be performed to form a work function layer 256 and a contact layer 262. Consequently, portions of the contact material layer 261, the work function material layer 255, the work function layer 252 and the gate dielectric layer 240 over the dielectric layer 220 may be removed. In other words, top surfaces of the dielectric layer 220 and the spacers 212 are exposed after the planarization process. In some embodiments, a resistance of the contact layer 262 is lower than a resistance of the work function layer 256. In some embodiments, the resistance of the contact layer 262 is lower than a resistance of the work function layer 252. In some embodiments, a resistance of a region between the fin structures 206 is greater than a resistance of a region above the fin structures 206. In some embodiments, a thickness of the work function layer 256 is within a range of approximately 1 angstrom to approximately 30 angstroms, but the disclosure is not limited thereto.

In some embodiments as shown in FIG. 15A, a top surface of the work function layer 256 and a top surface of the dielectric layer 220 are substantially on a same level. In some embodiments, a top surface of the contact layer 262 and the top surface of the dielectric layer 220 are substantially on a same level. In some embodiments, the contact layer 262 is separated from the dielectric layer 220 by the work function layer 256. In some embodiments, the work function layer 256 horizontally surrounds the contact layer 262. In some embodiments as shown in FIG. 15B, the contact layer 262 is separated from the gate trenches 232 by the work function layer 256. In some embodiments, a bottom surface of the contact layer 262 is higher than the top surfaces of the fin structures 206. As shown in FIGS. 15A and 15B, the contact layer 262 is not between the fin structures 206. Because the gate trenches 232 between the fin structures 206 are filled with the work function layer 256 and are free of the contact layer 262, the triggered voltage instability issue can be mitigated.

Additional features may be formed by subsequent processing after the formation of the contact layer 262 and the work function layer 256. For example, various contacts/vias/lines and multilayer interconnect features (e.g., metal layers and interlayer dielectrics) may be formed over the substrate 202, configured to connect the contact layer 262 of the semiconductor structure 20. For example, a multilayer interconnection includes vertical interconnects, such as vias or contacts, and horizontal interconnects, such as metal lines. The various interconnection features may implement various conductive materials including copper, tungsten, and/or silicide. In some embodiments, a gate via (not shown) may be formed over the contact layer 262. In some embodiments, the gate via directly contacts the contact layer 262. In some embodiments, the gate via is separated from the work function layer 256 by the contact layer 262. In some embodiments, a bottom surface of the gate via and the top surface of the dielectric layer 220 are substantially at a same level. In some embodiments, a bottom surface of the gate via is higher than the top surface of the dielectric layer 220. In some embodiments, a bottom surface of the gate via is higher than the top surface of the fin structures 206.

Figure 16A:
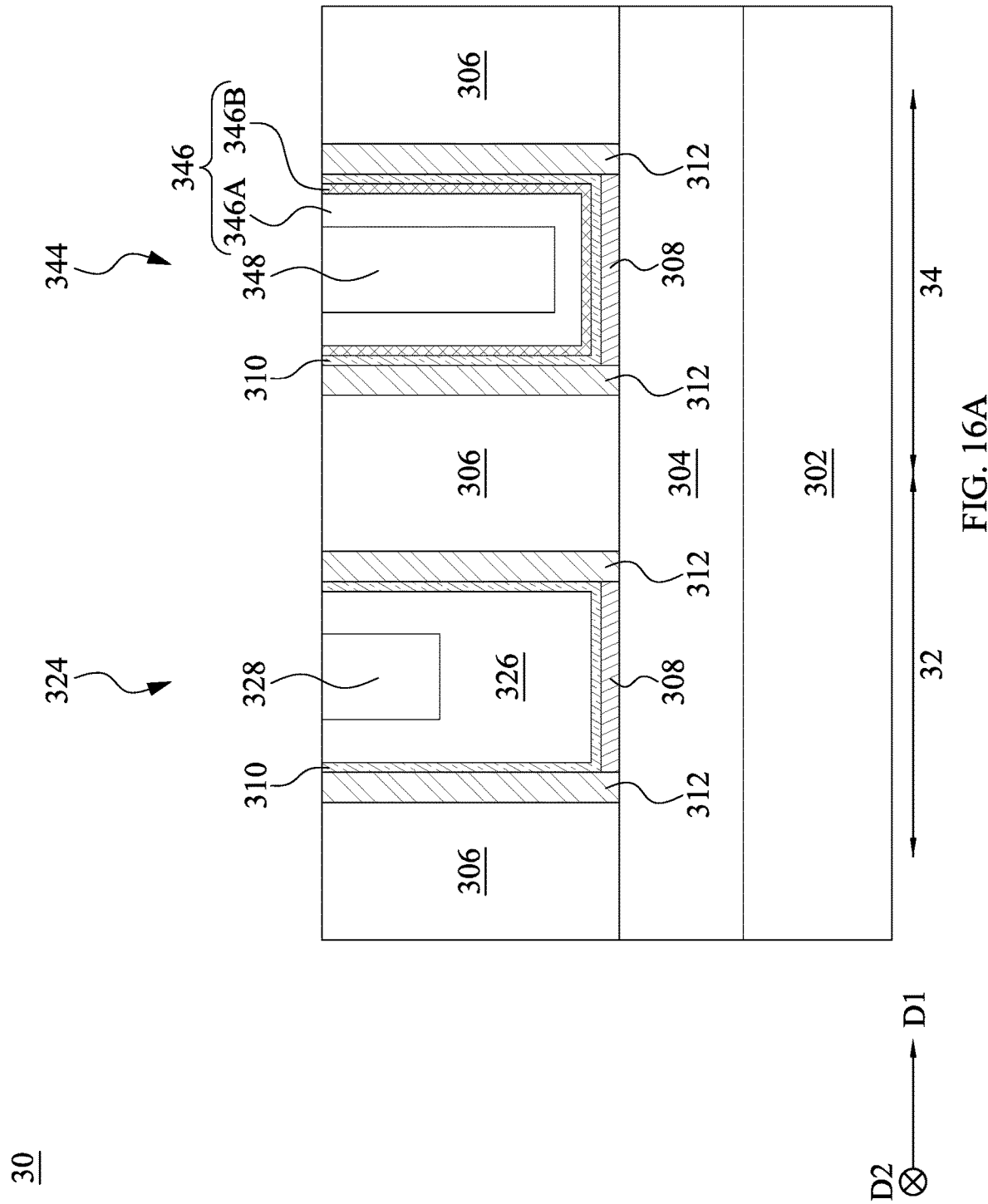
FIG. 16A and FIG. 16B are different cross-section views illustrating a semiconductor structure according to aspects of the present disclosure in one or more embodiments.
Figure 16B:
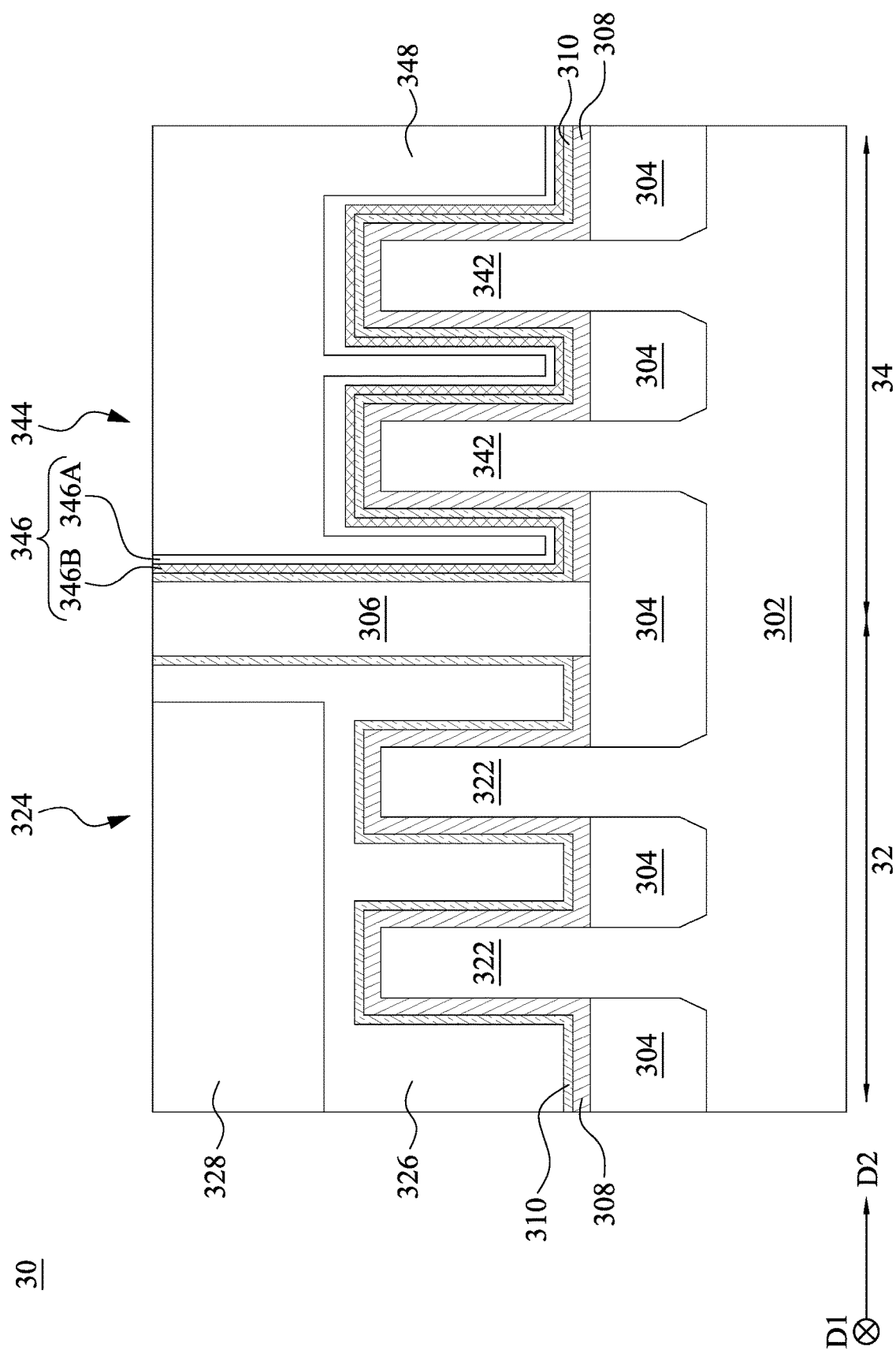

FIGS. 16A and 16B are different cross-section views illustrating a semiconductor structure 30 according to aspects of the present disclosure in one or more embodiments. Referring to FIGS. 16A and 16B, the semiconductor structure 30 includes a substrate 302, isolation structures 304. The semiconductor structure 30 includes a first device 32 and a second device 34. The semiconductor structure 30 further includes a dielectric layer 306 between the first device 32 and the second device 34. The dielectric layer 306 separates the first device 32 from the second device 34. The semiconductor structure 30 further includes a patterned dielectric layer 308, a gate dielectric layer 310 and spacers 312 similar to those of the semiconductor structure 20, and are hereby omitted from discussion for brevity.

The first device 32 may include first fin structures 322 and a first gate structure 324 across the first fin structures 322. The first gate structure 324 may include a first work function layer 326 over the first fin structures 322. In some embodiments, the first work function layer 326 is a single-layered structure. In some embodiments, the first gate structure 324 further includes a first contact layer 328 over the first work function layer 326. In some embodiments, a resistance of the first contact layer 328 is lower than a resistance of the first work function layer 326. In some embodiments, a bottom surface of the first contact layer 328 is higher than top surfaces of the first fin structures 322. In some embodiments, a resistance of a region between the first fin structures 322 is greater than a resistance of a region above the first fin structures 322. In some embodiments, a region between two adjacent first fin structures 322 is free of the first contact layer 328. Because the region between two adjacent first fin structures 322 is free of the first contact layer 328 and are filled with the first work function layer 326, the triggered voltage instability issue can be mitigated.

The second device 34 may include second fin structures 342 and a second gate structure 344 across the second fin structures 342. The second gate structure 344 may include a second work function layer 346 over the second fin structures 342. In some embodiments, the second work function layer 346 is a multilayered structure. The second work function layer 346 may include the work function sublayers 346A and 346B. In some embodiments, the work function sublayers 346A and 346B may include different work function metal materials. In some embodiments, the second gate structure 344 further includes a second contact layer 348 over the second work function layer 346. In some embodiments, a resistance of the second contact layer 348 is lower than a resistance of the second work function layer 346. In some embodiments, a bottom surface of the second contact layer 348 is lower than top surfaces of the second fin structures 342. In some embodiment as shown in FIG. 16B, at least a portion of the second contact layer 348 is between two adjacent second fin structures 342. In some embodiments, a resistance of a region between the second fin structures 342 is similar to a resistance of a region above the second fin structures 342.

In some embodiments, the first work function layer 326 and the second work function layer 346 include different materials, such as different work function metal materials. In some embodiments, the first contact layer 328 is separated from the dielectric layer 306 by the first work function layer 326, while the second contact layer 348 is separated from the dielectric layer 306 by the second work function layer 346. In other embodiments, the first contact layer 328 contacts the dielectric layer 306 (e.g. FIG. 12B), while the second contact layer 348 is separated from the dielectric layer 306 by the second work function layer 346. In some embodiments, the bottom surface of the first contact layer 326 is higher than the bottom surface of the second contact layer 348. In some embodiments, the bottom surface of the second contact layer 348 is lower than the top surface of the first fin structures 322.

The semiconductor structure 30 may include various devices depending on design requirements. In some embodiments, the first device 32 and the second device 34 may be different types of MOS devices. In some embodiments, the first device 32 and the second device 34 may be different generations of MOS devices. In some embodiments, a size of the first fin structures 322 and a size of the second fin structures 342 may be different. In some embodiments, a width of the first fin structures 322 and a width of the second fin structures 342 are within a range of approximately 1 nanometer to approximately 10 nanometers, but the disclosure is not limited thereto. In some embodiments, the size of the second fin structures 342 is greater than the size of the first fin structures 322. In some embodiments, a spacing between the first fin structures 322 is smaller than a spacing between the second fin structures 342. According to different design requirements for different devices, the first contact layer 328 is not between the first fin structures 322 while the second contact layer 348 is between the second fin structures 342.

Figure 17:
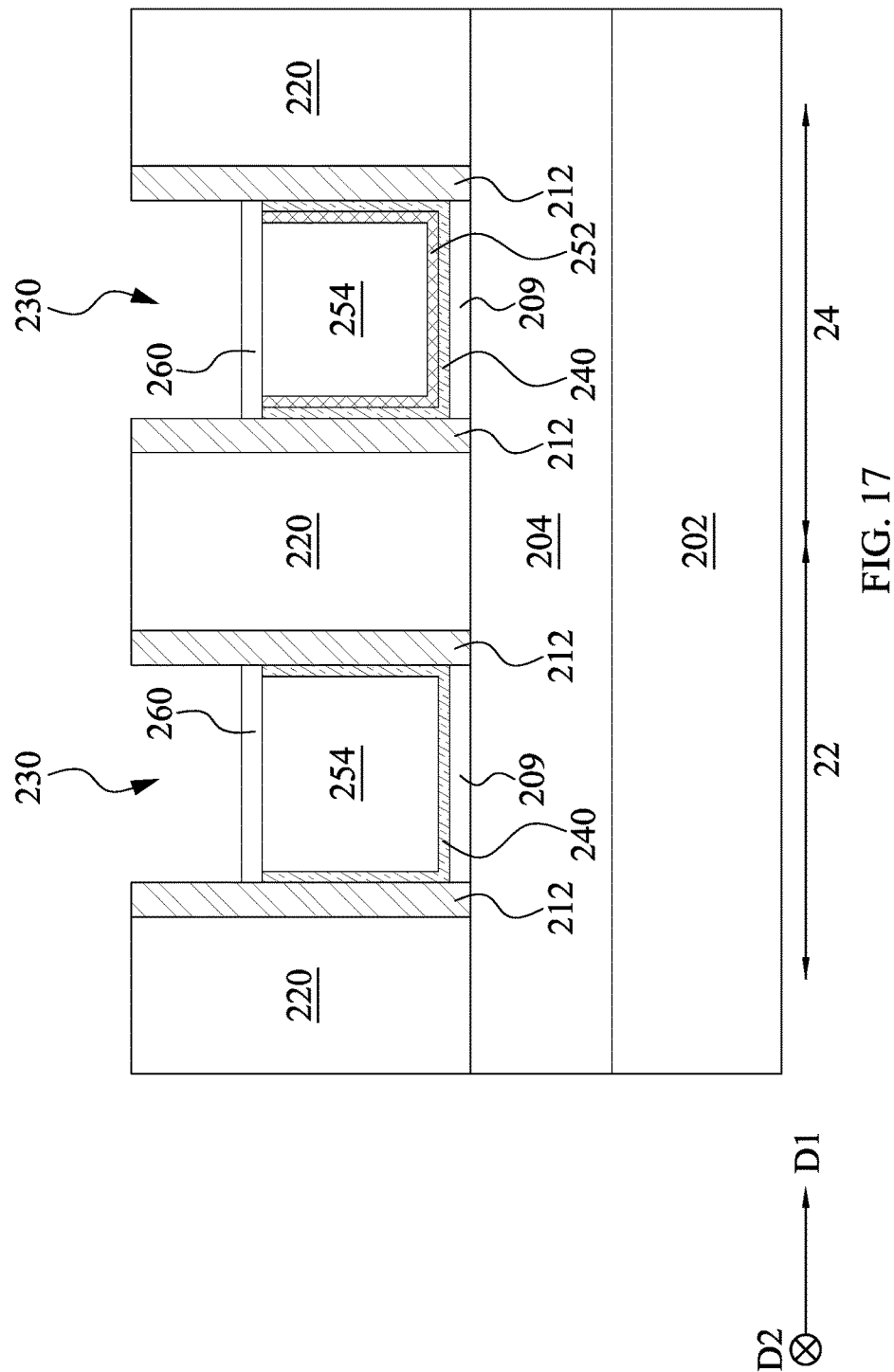
FIG. 17 is a cross-sectional view illustrating a semiconductor structure according to aspects of the present disclosure in one or more embodiments.

FIG. 17 is a cross-sectional view illustrating a semiconductor structure according to aspects of the present disclosure in one or more embodiments. Referring to FIG. 17, in some embodiments, when a core FET device is required, the patterned dielectric layer 208 is removed to expose the fin structures 206 to the gate trenches 230. Subsequently, the gate dielectric layer 240, the work function layers 252, 254 and the contact layer 260 are formed in the gate trenches 230. In some embodiments, an interfacial layer (IL) 209 is formed in the gate trenches 230 prior to the forming of the gate dielectric layer 240. The IL 209 may include an oxide-containing material such as SiO or SiON. In some embodiments, the IL 209 covers the portions of fin structure 206 in the gate trench 230.

Figure 18:
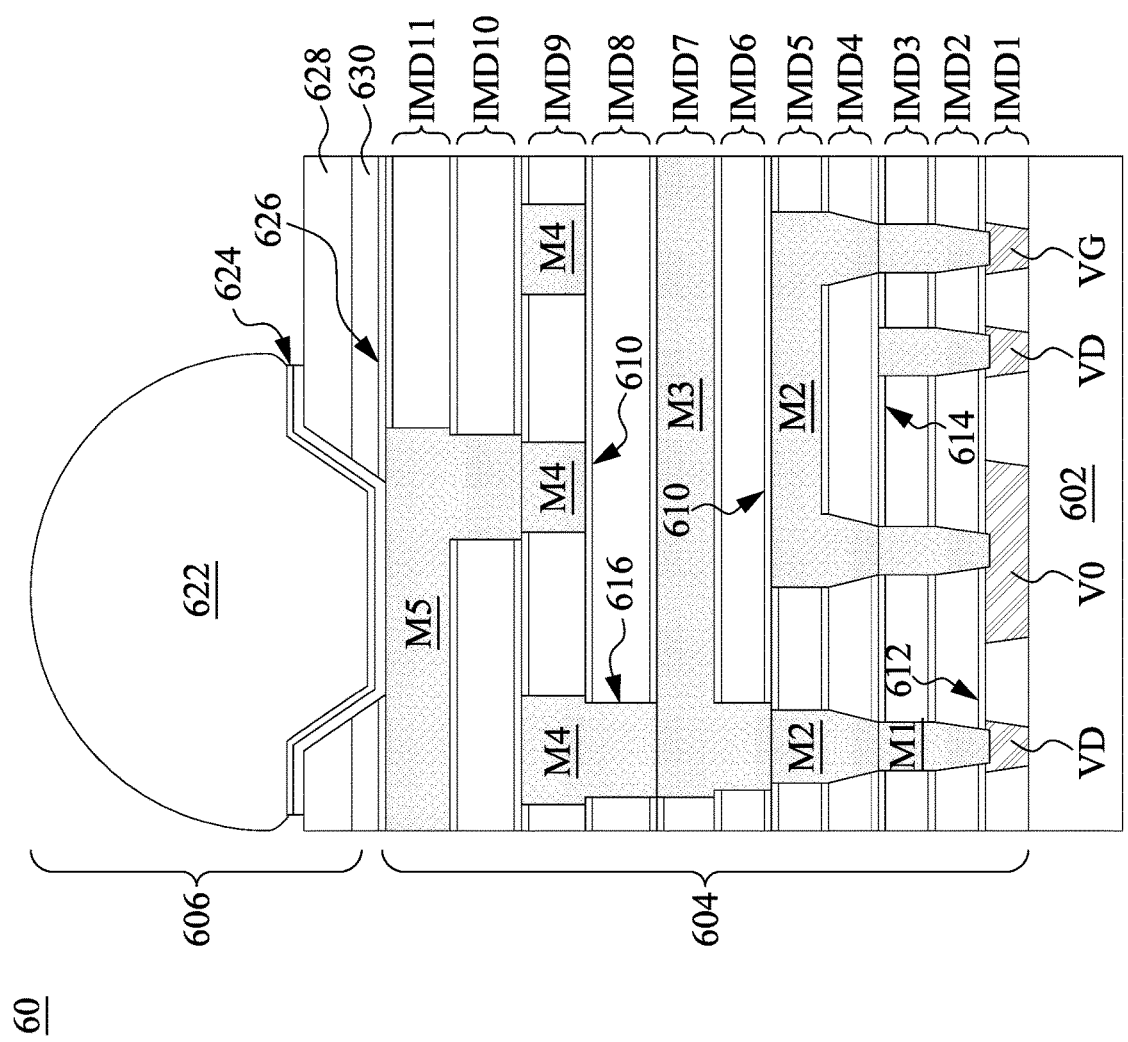
FIG. 18 is a cross-sectional view illustrating a semiconductor structure according to aspects of the present disclosure in one or more embodiments.

FIG. 18 is a cross-sectional view illustrating a semiconductor device 60 according to aspects of the present disclosure in one or more embodiments. The semiconductor device 60 may have a semiconductor structure 602 and an interconnect structure 604. Many aspects of the semiconductor structure 602 may be similar to the semiconductor structures 20, 30 and 40, and are hereby omitted from discussion for brevity.

In some embodiments, the interconnect structure 604 includes a plurality of conductive layers labeled M1 through M5 Further, the conductive layers M1 through M5 are disposed in a plurality of inter-metal dielectric layers labeled IMD1 through IMD11. The inter-metal dielectric layers IMD1 through IMD11 may provide electrical insulation as well as structural support for the various features during subsequent fabrication operations. In some embodiments, the conductive layers M1 through M5 can include W, Al, Cu, AlCu, and the like. In some embodiments, the inter-metal dielectric layers IMD1 through IMD11 may be formed of low-κ dielectric material. In some embodiments, the inter-metal dielectric layers IMD1 through IMD11 may include spin-on dielectric (SOD), phosphor-silicate glass (PSG), or the like. In some embodiments, the interconnect structure 604 further includes etch stop layers 610, seal layers 612 and oxide layers 614 disposed between the inter-metal dielectric layers IMD1 through IMD11. In some embodiments, the etch stop layers 610 and the seal layers 612 include silicon nitride, silicon carbide, and the like. In some embodiments, the oxide layers 614 include silicon dioxide, and the like. In some embodiments, the interconnect structure 604 further includes barrier layers 616, such as Ta/TaN barrier layers, surrounding the conductive layers M1 through M5.

In some embodiments, the inter-metal dielectric layer IMD1 includes conductive vias, such as gate via VG, drain via VD, and conductive via V0. In some embodiments, the gate via VG may be disposed over the contact layer (not shown) of the semiconductor structure 602, such as the contact layers 260, 262, 328 and 348. In some embodiments, the gate via VG directly contacts the contact layer of the semiconductor structure 602.

In some embodiments, the semiconductor device 60 further includes a bonding structure 606. In some embodiments, the bonding structure 606 includes a solder bump 622, a liner 624, a number of seal layers 626 and 628, and a dielectric layer 630. In some embodiments, the solder bump 622 may be lead free. In some embodiments, the liner 624 may include Cr, Cu, Au, and the like. In some embodiments, the seal layers 626 and 628 may include nitride, oxide, and the like. In some embodiments, the dielectric layer 630 may include phosphor-silicate glass (PSG).

Based on the above, the present disclosure offers semiconductor structures and methods for forming the semiconductor structures. The bottom surface of the contact metal is designed to be higher than the top surface of the fin structures. The location of the contact metal is not between the fin structures. Accordingly, the triggered voltage instability issue can be mitigated.

The present disclosure provides many different embodiments of semiconductor structures and methods for forming the semiconductor structures that provide one or more improvements over existing approaches. In some embodiments, a semiconductor structure is provided. The semiconductor structure includes a substrate, a plurality of fin structures over the substrate, and a gate structure across the plurality of fin structures. The gate structure includes a gate dielectric layer over the plurality of fin structures, a work function layer over the gate dielectric layer, and a contact layer over the work function layer. In some embodiments, a portion of the work function layer is located between the plurality of fin structures, and a top surface of the portion is higher than a top surface of the plurality of fin structures. The semiconductor structure further includes a dielectric layer over the substrate. In some embodiments, a top surface of the work function layer and a top surface of the dielectric layer are substantially on a same level.

In some embodiments, a semiconductor structure is provided. The semiconductor structure includes a substrate, a first device and a second device. The first device includes a plurality of first fin structures over the substrate, and a first gate structure across the plurality of first fin structures. In some embodiments, the first gate structure includes a first work function layer over the plurality of first fin structures, and a first contact layer over the first work function layer. In some embodiments, a bottom surface of the first contact layer is higher than a top surface of the plurality of first fin structures. The second device includes a plurality of second fin structures over the substrate, and a second gate structure across the plurality of second fin structures. In some embodiments, the second gate structure includes a second work function layer over the plurality of second fin structures, and a second contact layer over the second work function layer. In some embodiments, a bottom surface of the second contact layer is lower than a top surface of the plurality of second fin structures.

In some embodiments, a method for forming a semiconductor structure is provided. The method includes following operations. A substrate having a plurality of fin structures is received. A gate dielectric layer is formed over the plurality of fin structures. A work function layer is formed over the gate dielectric layer. In some embodiments, a portion of the work function layer is located between the plurality of fin structures, and a top surface of the portion is higher than a top surface of the plurality of fin structures. A contact layer is formed over the work function layer. In some embodiments, a bottom surface of the contact layer is higher than a top surface of the plurality of fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein.

What is claimed is:

1. A semiconductor structure, comprising:
   a substrate;
   a plurality of fin structures over the substrate;
   a gate structure across the plurality of fin structures, wherein the gate structure comprises:
      a gate dielectric layer over the plurality of fin structures;
      a work function layer over the gate dielectric layer, wherein a portion of the work function layer is located between the plurality of fin structures, and a top surface of the portion is higher than a top surface of the plurality of fin structures; and
      a contact layer over the work function layer; and
   a dielectric layer over the substrate, wherein a top surface of the work function layer and a top surface of the dielectric layer are substantially on a same level,
   wherein a distance between a bottom surface of the work function layer and a bottom surface of the contact layer is greater than a distance between a side surface of the work function layer and a side surface of the contact layer.

2. The semiconductor structure according to claim 1, wherein the dielectric layer is between the plurality of fin structures.

3. The semiconductor structure according to claim 1, wherein the bottom surface of the contact layer is higher than the top surface of the plurality of fin structures.

4. The semiconductor structure according to claim 1, wherein a top surface of the contact layer is aligned with the top surface of the work function layer.

5. The semiconductor structure according to claim 1, wherein the contact layer is separated from the dielectric layer.

6. The semiconductor structure according to claim 1, further comprising:
   a plurality of gate trenches between two adjacent fin structures of the plurality of fin structures, wherein the contact layer is separated from the plurality of gate trenches by the work function layer.

7. The semiconductor structure according to claim 1, further comprising:
   a gate via over the contact layer of the gate structure.

8. The semiconductor structure according to claim 1, further comprising:
   a spacer along the gate structure, wherein a top surface of the spacer and the top surface of the dielectric layer are substantially on a same level.

9. A semiconductor structure, comprising:
   a substrate;
   a first device, comprising:
      a plurality of first fin structures over the substrate; and
      a first gate structure across the plurality of first fin structures, wherein the first gate structure comprises a first work function layer over the plurality of first fin structures, and a first contact layer over the first work function layer, wherein a bottom surface of the first contact layer is higher than a top surface of the plurality of first fin structures; and
   a second device, comprising:
      a plurality of second fin structures over the substrate; and
      a second gate structure across the plurality of second fin structures, wherein the second gate structure comprises a second work function layer over the plurality of second fin structures, and a second contact layer over the second work function layer, wherein a bottom surface of the second contact layer is lower than a top surface of the plurality of second fin structures,
   wherein a thickness of the first contact layer is different from a thickness of the second contact layer.

10. The semiconductor structure according to claim 9, wherein the top surface of the plurality of first fin structures and the top surface of the plurality of second fin structures are substantially on a same level.

11. The semiconductor structure according to claim 9, wherein the bottom surface of the second contact layer is lower than the bottom surface of the first contact layer.

12. The semiconductor structure according to claim 9, wherein a region between two adjacent first fin structures of the plurality of first fin structures is free of the first contact layer.

13. The semiconductor structure according to claim 9, wherein the second contact layer extends to a region between two adjacent second fin structures of the plurality of second fin structures.

14. The semiconductor structure according to claim 9, wherein the first work function layer is a single-layered structure and the second work function layer is a multilayered structure.

15. The semiconductor structure according to claim 9, wherein the first work function layer and the second work function layer comprise different materials.

16. The semiconductor structure according to claim 9, further comprising:
a dielectric layer over the substrate, wherein the dielectric layer is between the first device and the second device.

17. The semiconductor structure according to claim 16, wherein the second contact layer is separated from the dielectric layer by the second work function layer.

18. A method for forming a semiconductor structure, comprising:
receiving a substrate having a plurality of fin structures;
forming a gate dielectric layer over the plurality of fin structures;
forming a work function layer over the gate dielectric layer, wherein a portion of the work function layer is located between the plurality of fin structures, and a top surface of the portion is higher than a top surface of the plurality of fin structures; and
forming a contact layer over the work function layer, wherein a bottom surface of the contact layer is higher than the top surface of the plurality of fin structures, wherein a distance between a bottom surface of the work function layer and the bottom surface of the contact layer is greater than a distance between a side surface of the work function layer and a side surface of the contact layer.

19. The method according to claim 18, further comprising:
forming a gate via over the contact layer.

20. The method according to claim 18, further comprising:
removing a portion of the work function layer.

* * * * *